United States Patent [19]

Iwaoka et al.

[11] Patent Number: 4,893,353
[45] Date of Patent: Jan. 9, 1990

[54] OPTICAL FREQUENCY SYNTHESIZER/SWEEPER

[75] Inventors: Hideto Iwaoka; Akira Ohte; Koji Akiyama, all of Tokyo, Japan

[73] Assignee: Yokogawa Electric Corporation, Tokyo, Japan

[21] Appl. No.: 942,448

[22] Filed: Dec. 16, 1986

[30] Foreign Application Priority Data

| Dec. 20, 1985 | [JP] | Japan | 60-287162 |
| Dec. 26, 1985 | [JP] | Japan | 60-294342 |
| Jan. 24, 1986 | [JP] | Japan | 61-11894 |
| Feb. 26, 1986 | [JP] | Japan | 61-40772 |
| Feb. 26, 1986 | [JP] | Japan | 61-40773 |
| Jun. 24, 1986 | [JP] | Japan | 61-96170 |
| Jun. 26, 1986 | [JP] | Japan | 61-98194 |
| Jun. 27, 1986 | [JP] | Japan | 61-97611 |
| Jun. 27, 1986 | [JP] | Japan | 61-149777 |
| Jul. 17, 1986 | [JP] | Japan | 61-168924 |
| Aug. 26, 1986 | [JP] | Japan | 61-199364 |
| Sep. 19, 1986 | [JP] | Japan | 61-221668 |

[51] Int. Cl.$^4$ .............................................. H04B 9/00
[52] U.S. Cl. .................................... 455/612; 455/618; 370/3
[58] Field of Search ............... 370/3; 455/612, 619, 455/617, 618; 350/96.16; 372/32; 356/349

[56] References Cited

U.S. PATENT DOCUMENTS

| 3,593,189 | 7/1971 | Buhrer | 372/32 |
| 3,718,868 | 2/1973 | Pao et al. | 372/32 |
| 3,793,595 | 2/1974 | Russo et al. | 372/32 |
| 3,842,367 | 10/1974 | Schlossberg | 372/32 |
| 3,899,748 | 8/1975 | Bodlaj | 372/32 |
| 3,908,121 | 9/1975 | Riseberg et al. | 455/610 |
| 3,921,099 | 11/1975 | Abrams et al. | 372/32 |
| 3,970,839 | 7/1976 | Javan | 372/32 |
| 3,975,628 | 8/1976 | Graves et al. | 455/619 |
| 4,434,490 | 2/1984 | Kavaya et al. | 372/32 |
| 4,579,417 | 4/1986 | Ih | 350/96.11 |
| 4,706,300 | 10/1987 | Minemura et al. | 455/608 |
| 4,716,444 | 12/1987 | Mongeon et al. | 372/32 |

OTHER PUBLICATIONS

Favre et al.; "Progress Towards Heterodyne-Type Single-Mode Fiber Communication Systems"; *IEEE Journal of Quantum Electronics*; vol. QE-17; No. 6; Jun. 1981; pp. 897-905.

Primary Examiner—Robert L. Griffin
Assistant Examiner—L. Van Beek
Attorney, Agent, or Firm—Moonray Kojima

[57] ABSTRACT

An optical frequency synthesizer and/or sweeper, whereby a coherent optical output light is obtained by using a wavelength stabilized laser and an optical phase locked loop wherein the frequency of the output has the characteristics of high accuracy, high stability and narrow spectral line width. The optical phase locked loop comprises a tunable laser, an optical frequency multiplier, an optical frequency shifter and an optical heterodyne detector, wherein the optical phase locked loop is capable of precisely outputting an arbitrary wavelength by feeding back an output optical frequency.

36 Claims, 35 Drawing Sheets

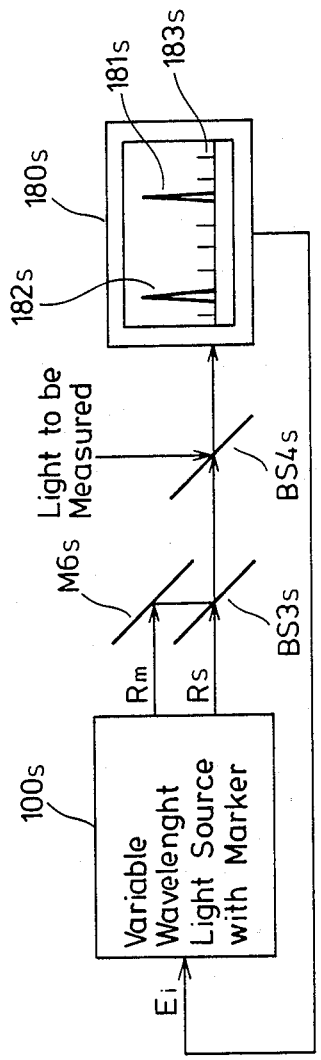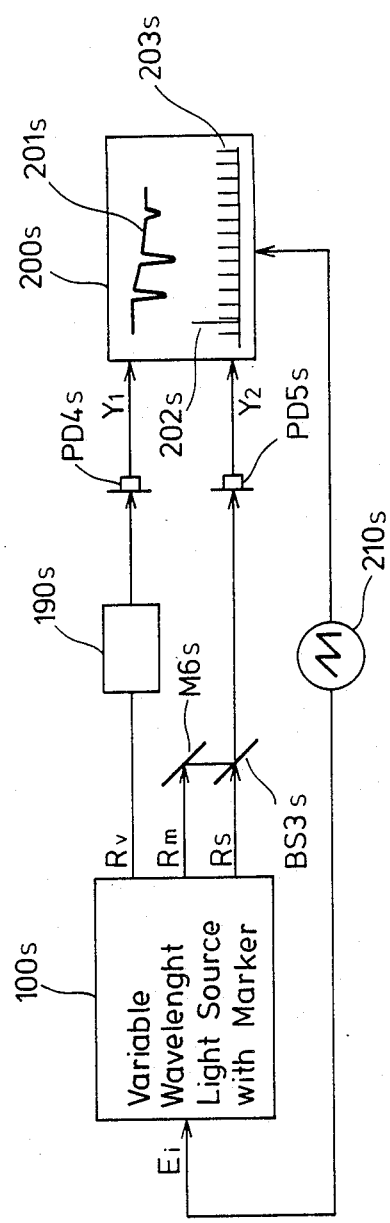

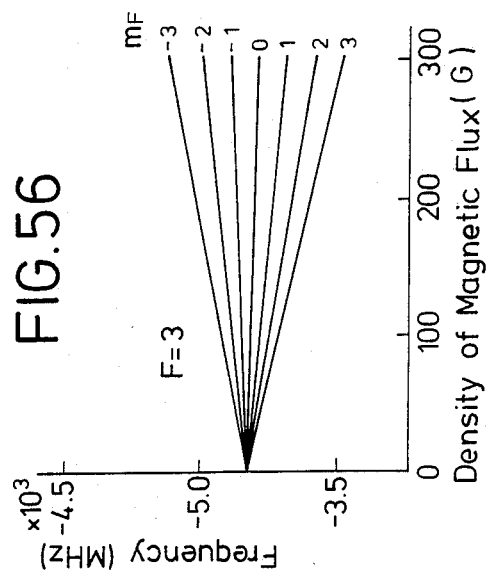
FIG. 56
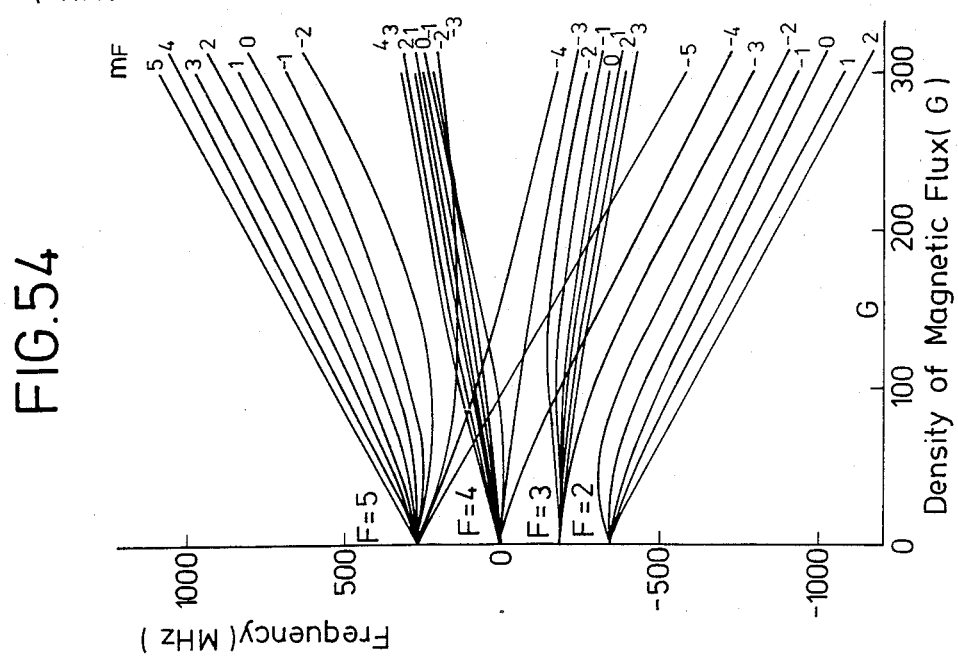
FIG. 55
FIG. 54

FIG.58

| Substrate \ Components | Semiconductor GaAs(InP) | Semiconductor Si | Ferrodielectric Substance LiNbO₃ LiTaO₃ | Insulator SiO₂ (Glass Crystal) |
|---|---|---|---|---|
| Laser | Monolithic | External Fitting, Hybrid | External Fitting, Hybrid | External Fitting Hybrid |
| Light Receiving Element | Monolithic | Monolithic | External Fitting, Hybrid | External Fitting Hybrid |
| AOM | SAW | Transducer | SAW | Transducer |
| Absorption Cell | Hole→Glass Coat Sealing→Cover | Hole→Thermal Oxidation Sealing→Cover | Hole→Glass Coat Sealing→Cover | Hole→Sealing→Cover (Evanescent Effect is Permissible) |
| Fabry-Perot Adjusting Method for Broad Band Region Feedback Configuration (Hole Ridge Dope) | Temperature or Electric Current | Temperature or Electric Current | Temperature or Electric Field | Temperature |
| Thermal Control (Laser F-P) | Thin Film Resistance or the Like | Thin Film Resistance or the Like | Thin Film Resistance or the Like | Thin Film Resistance or the Like |
| Circuit | Hybrid | Identical Substrate Monolithic | Hybrid | Hybrid |

OPTICAL FREQUENCY SYNTHESIZER/SWEEPER

BACKGROUND OF THE INVENTION

1. Field of Invention

This invention relates to an optical frequency synthesizer and/or sweeper (referred to as synthesizer/sweeper), which emits coherent light having its frequency, phase, amplitude and polarization all selectively controlled.

2. Description of the Prior Art

A conventional laser light source having a wavelength sweeping function may be one of the following types which are depicted in FIGS. 1 and 2.

(A) In one type, the temperature properties of a wavelength of a semiconductor laser are utilized, and the wavelength is swept by varying temperature of a laser diode. FIG. 1 is an explanatory view showing its principle. A constant temperature oven TB is controlled by a temperature control means TC, thereby sweeping an output wavelength of a laser diode LD. In this case, the sweeping width comes to several tens of nanometers.

(B) In another type, a prism is provided within a resonator and rotated and an oscillation wavelength is swept by making the most of a large width of gain of a coloring laser. In FIG. 2, which describes such other type, there is provided a mirror M, a coloring cell CC, a lens LS, a prism P, and a half mirror HM. The sweeping width is approximately 100 nm.

These tunable laser light sources are, however, disadvantageous. For example, the accuracy of wavelength is undesirably at most 1 nm (at 300 GHz). In the fields of prospective coherent light communications and optical photo-applied measurements, frequency measurement with accuracy of less than the level of MHz is required. Hence, the above described laser light sources are not useable as coherent light measuring devices.

SUMMARY OF THE INVENTION

Accordingly, an object of the invention is to overcome the aforementioned and other disadvantages and deficiencies of the prior art.

Another object is to provide an optical frequency synthesizer/sweeper capable of obtaining a coherent light output, the optical frequency of which has the characteristics of high accuracy, high stability and narrow spectral line width, by a step wherein a reference wavelength light source outputs light having a stable wavelength, and an optical phase locked loop outputs light with a wavelegnth corresponding to the output wavelength such as to be predeterminately associated therewith.

BRIEF DESCRIPTION OF THE DRAWING

FIG. 20 is a block diagram depicting a device used as the light source of a conventional optical spectrum analyzer or spectroscope.

FIG. 21 is a block diagram depicting an optical network analyzer defined as third example of the marker attached variable wavelength light source.

FIGS. 54 through 56 are views depicting an aspect of Zeeman separation of an energy level of the Cs atom.

FIG. 58 is a table depicting methods of fabricating the respective component of the arrangement of FIG. 57.

DETAILED DESCRIPTION OF PREFERRED EMBODIMENTS

Figure 1:
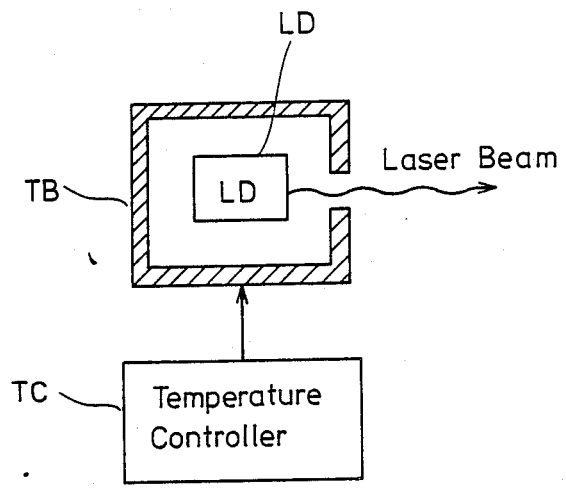
FIGS. 1 and 2 are diagrams depicting a conventional tunable laser light source.
Figure 2:
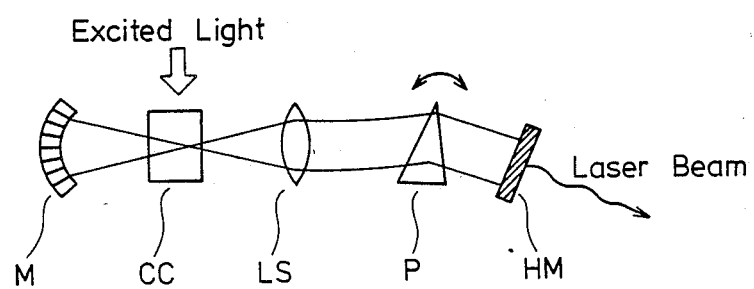
Figure 3:
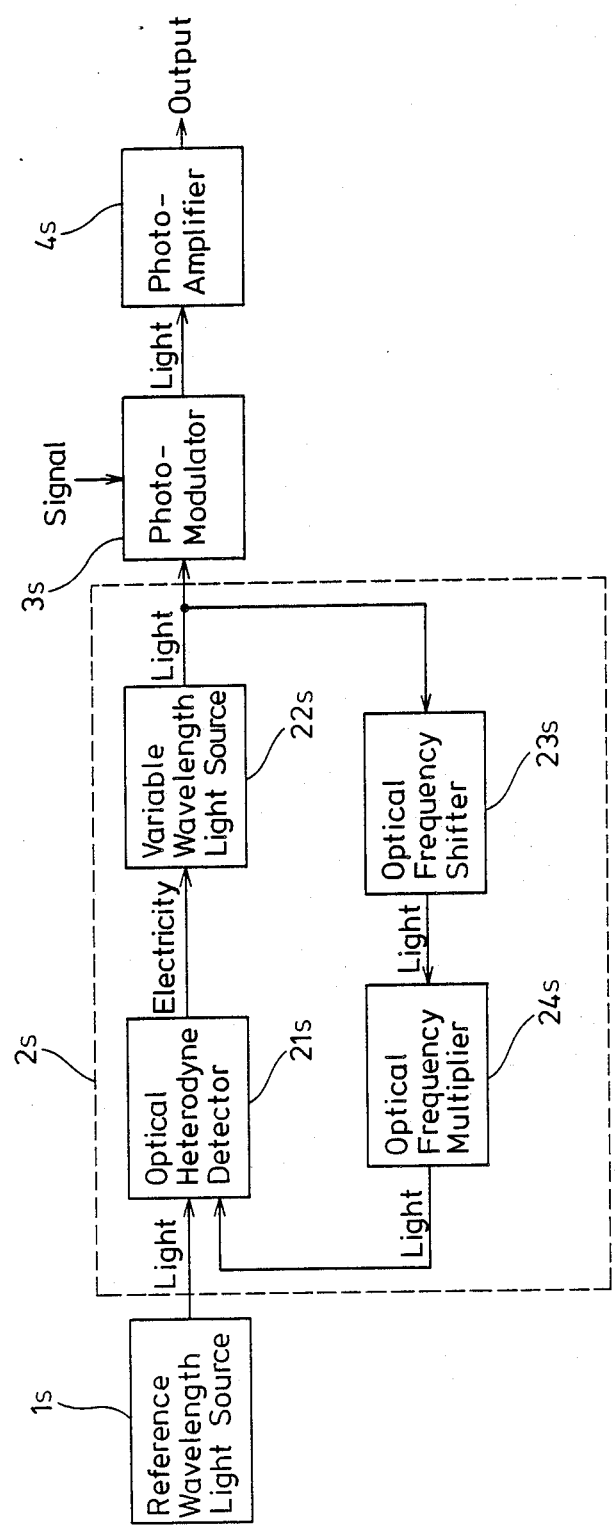
FIG. 3 is a block diagram depicting a first illustrative embodiment of the invention.

Referring to FIG. 3, the illustrative optical frequency synthesizer/sweeper comprises a reference wavelength light source 1s having a stabilized wavelength; an optical phase locked loop 2s for inputting output light from reference source 1s; photo modulating member 3s for modulating output light from loop 2s; photo amplifying member 4s for amplifying output light from member 3s (the loop 2s comprises an optical heterodyne detecting member 21s which receives output light, as an input from one side, from source 1s); a variable wavelength light source 22s wherein an oscilation wavelength of output light is controlled by operation of output signals from member 21s; an optical frequency shifter 23s for shifting a frequency of output light from light source 22s; and an optical frequency multiplier 24s for multiplying the frequency of output light from shifter 23s and for supplying output light as an input to the other side of member 21s.

Operation of the embodiment is a follows. When the output light from source 1s is inputted to loop 2s, loop 2s fixes (i.e. locks) a wavelength of the optical output to one corresponding to the oscillation wavelength of source 1s. To be specific, member 21s makes a comparison between the output light emitted from source 1s and output light from multiplier 24s, and controls source 22s so as to diminish the difference obtained by the comparison. The shifter 23s, in a feedback circuit, adds an offset frequency to the output light from source 22s; and multiplier 24s determines a ratio of the frequency of output light from source 1s to the frequency of output light from source 22s. Modulator 3s modulates the output from loop 2s; and amplifier 4s generates an output signal of the synethesizer/sweeper after amplifying the output light from modulator 3s.

Figure 4:
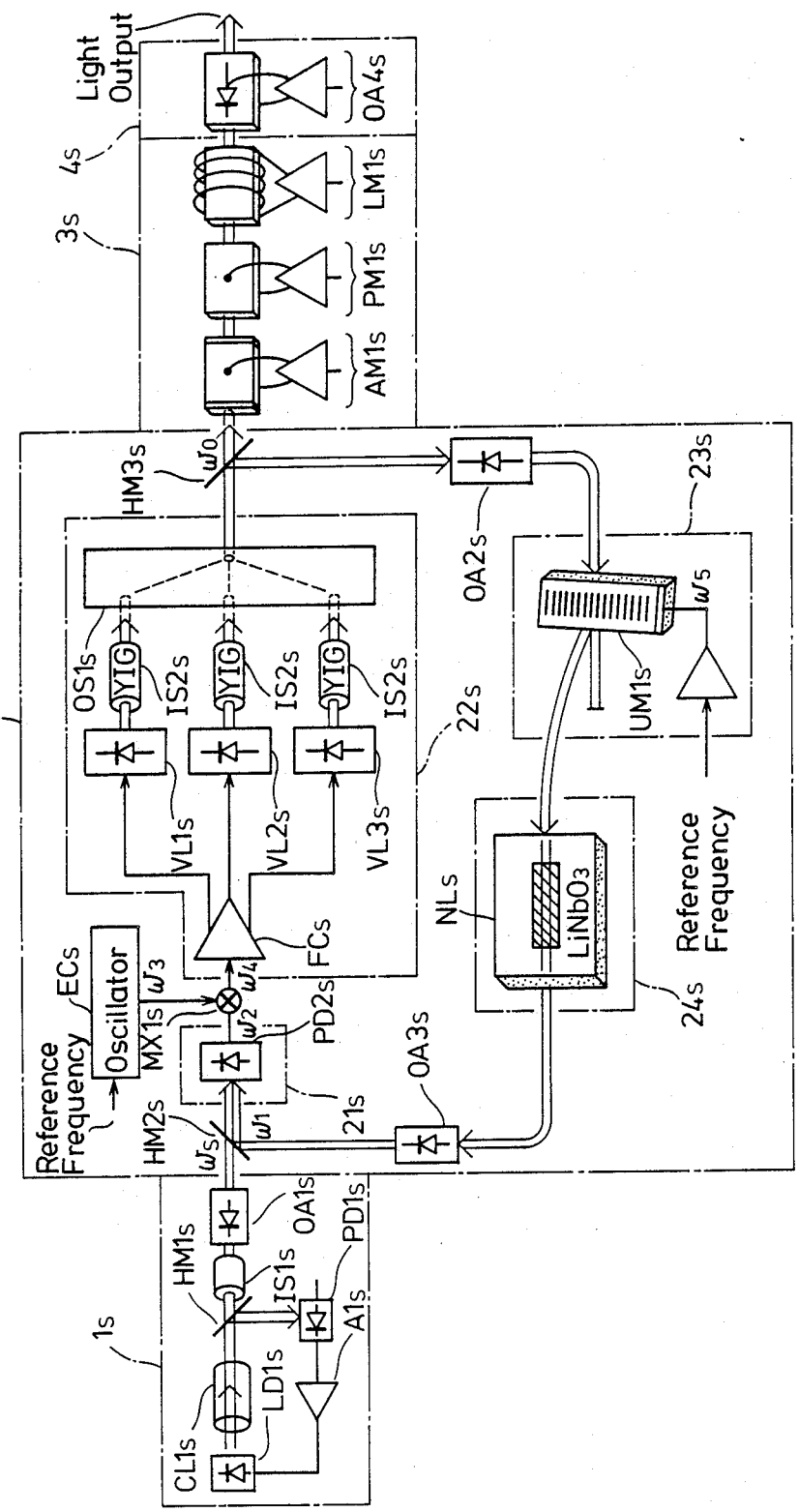
FIG. 4 is a block diagram depicting a second illustrative embodiment of the invention, wherein the embodiment of FIG. 3 comprises definite components.

FIG. 4 depicts greater details of the arrangement of FIG. 3. For example, light source 1s comprises a laser diode LD1s; an absorption cell CL1s for stabilizing output light emitted from laser LD1s and comprises Rb gas or Cs gas enclosed therewithin; a half mirror HM1s upon which output light from cell CL1s falls; a photo diode PD1s for inputting light reflected on half mirror HM1s; a control circuit A1s for inputting an electric output from photo diode PD1s and for controlling electric current applied to laser diode LD1s by utilizing output corresponding to the electric output from PD1s. In the same source 1s, a returning light preventing isolator IS1s passes transmitted light from half mirror HM1s; and photo amplifying element OA1s receives light which passes isolator IS1s. Loop 2s comprises a half mirror HM2s which receives output light from light source 1s; a photo diode PD2s comprises a PIN photo diode, an avalance photo diode, or the like for inputting light transmitted through half mirror HM2s (this photo diode PD2s constitutes an optical heterodyne detecting member 21s); an oscillator ECs which generates an electrical signal having a predetermined frequency by inputting reference frequency from a crystal (not shown); a mixer circuit MX1s to which both the electric output from oscillator ECs and electric output from member PD2s are connected. Variable wavelength light source 22s, to which output from mixer MX1s is connected comprises an optical frequency modulating circuit FCs, tunable laser diodes VL1s, VL2s, VL3s for receiving output signals from modulators FCs; an isolator IS2s through which fluxes of output light from diodes VL1s, VL2s, VL3s pass (this isolator IS2s comprises YIG (yttrium iron garnet)); and an optical switch OS1s for switching light received from a plurality (3 in FIG. 4 ) of isolators IS2s. Output light from optical switch OS1s strikes a half mirror HM3s. A photo amplifying element OA3s receives light reflected on half mirror HM3s. An ultrasonic modulator UM1 receives output light from amplifier OA2s. (Modulator UM1s constitutes optical frequency shifter 23s). A light waveguide path NLs, which comprises a non linear material, receives output light from shifter 23s. Light waveguide path NLs constitutes the optical frequency multiplying member 24s (of FIG. 3). A photo amplifying member or element OA3s amplifies output light from light waveguide path NLs. Modulator 3s which receives output light from optical phase locked loop 2s comprises an amplitude modulator AM1s; a phase modulator PM1s, which may both comprise an electro-optical crystal such as LiNbO$_3$; and a polarizing modulator LM1s which uses magneto-optical crystal such as YIG. Amplifier 4s comprises a photo amplifying element OA4s which amplifies output light from member 3s.

Operation of the FIG. 4 embodiment is as follows. The components of source 1s operate to control the oscillation wavelength of laser diode LD1s to absorption beams of Rb atoms (or Cs atoms) disposed within absorption cell CL1s, thereby to produce at high accuracy and high stability (more than $10^{-12}$) a stabilized or absolute wavelength of output light which is outputted from source 1s.

Figures 5A, 5B:
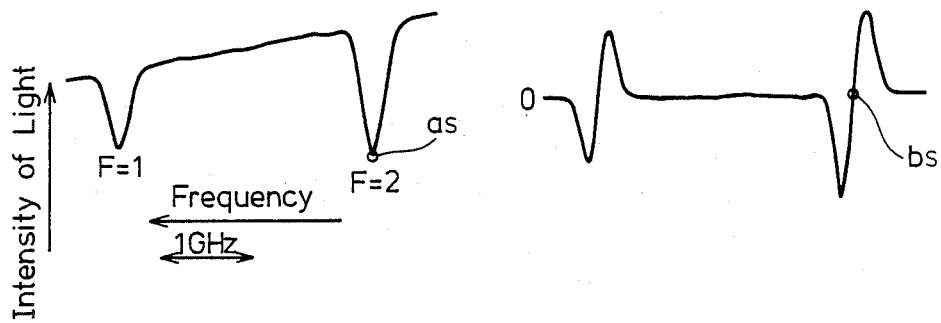
FIGS. 5(A) and 5(B) are diagrams depicting characteristic curves of operation of the embodiment of FIG. 4.
Figure 6:
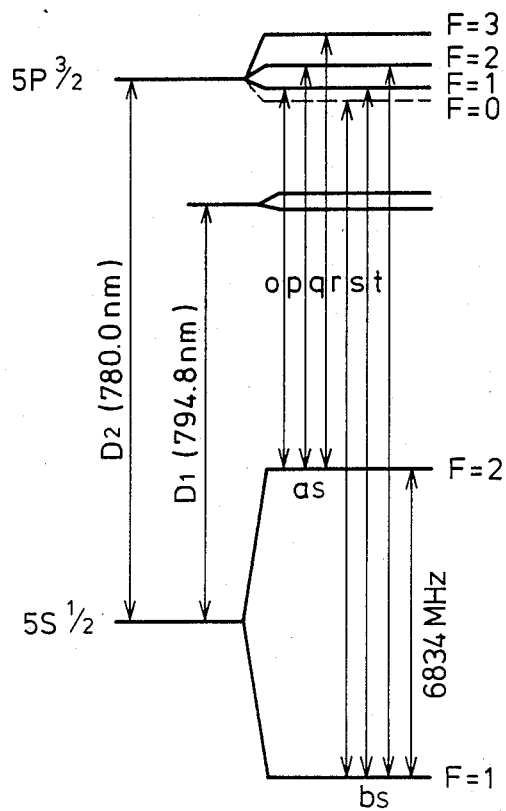
FIG. 6 is an explanatory view depicting operation of the embodiment of FIG. 4.

More specifically, the stabilizer components of source 1s operate as follows. When the wavelength of output light from laser diode LD1s passing through absorption cell CL1s accords with absorption beams of Rb gas (or Cs gas), the output light from laser diode LD1s is absorbed. Subsequently, such absorptive properties ( shown in FIG. 5(A)) are present. FIG. 6 is an explanatory view showing an energy level of Rb gas. The absorption beams of Rb are such that a D$_2$ beam is 780 nm and a D$_1$ beam is 795 nm. If the beams are multiplied, the results become 1560 nm and 1590 nm, respectively. These numeric values fall within a zone of 1500 nm, which is defined as an optical fiber communication wavelength, and hence this invention is favorable in that respect. This wavelength region is available for photo applied measurements.

Some fluxes of output light from cell CL1s are reflected by half mirror HM1s and are then detected by detector PD1s. Thereafter, output wavelength of light from laser diode LD1s is locked to the center of absorption by controlling the electric current supplied to laser diode by action of control circuit A1s such as to correspond to the output signal from detector PD1s. For example, when the output wavelength is to be locked to point $a_s$ of FIG. 5(A), it is fixed to point $b_s$ (value of differential waveform becomes zero) of FIG.5(B) which is a differential waveform of FIG. 5(A) in control circuit A1s by using a lock in amplifier. This is referred to as a linear absorption method. According to this method, the absorption spectrum becomes wide as in the case of FIG. 5(A).

However, absorption beams of the infinitesimal structure which are concealed on account of a Doppler shift are detected by saturated spectroscopy (see, T. Yabuzaki, A. Hori, M. Kitano, and T. Ogawa, "Frequency Stabilization of Diode Lasers Using Doppler Free Atomic Spectra," Proc. Int. Conf. Lasers 83). If the oscillation wavelength of output signals from laser diode LD1s is locked to the thus detected absorption beams, still higher stability is obtained. Laser diode LD1s is further stabilized in temperature by use of a constant temperature oven (not shown). The light which is transmitted through half mirror HM1s strikes isolator IS1s. Isolator IS1s prevents light returned from the outside by reflection, from changing into noises. The output light from isolator IS1s is, as occasion arises, amplified by means of amplifier element OA1s.

The optical phase locked loop 2s locks an oscillation wavelength of the signal from variable wavelength light source 22s to the oscillation wavelength of the reference wavelength light source 1s at a predetermined offset and ratio. Output light from source 1s is transmitted through half mirror HM2s and strikes diode PD2s of member 21s. The light fed back from multiplier 24s through amplifier element OA3s is reflected by half mirror HM2s and then strikes diode PD2s. Assume the output frequency of source 1s and the optical frequency of feedback light are $\omega s$ and $\omega 1$, respectively. Assume further that the frequency $\omega_2$ of output signal from detector member 21s is given by $\omega_2 = |\omega_s - \omega_1|$. Then, provided that the output frequency of oscillator ECs is $\omega_3$, the output $\omega_4$ of mixer MX1s (phase detecting circuit) is expressed as $\omega_4 = \omega_2 - \omega_3$, when the offset frequency is added to the output frequency $\omega_2$ of member 21s. The output electrical signal $\omega_4$ of mixer MX1s is inputted to circuit FCs of source 22s, and circuit FCs controls the optical frequencies of laser diodes VL1s to VL3s, so that the equations of $\omega_4 = 0$ is established.

In connection with laser diodes VL1s to VL3s, since a resonator is constituted by making the most of the reflection on a diffraction grating incorporated in a laser diode chip and the oscillation frequency is determined by the pitch of the diffraction grating, there may be used a DFB (distributed feedback) laser and an ADFB (acoustic DFB) laser which is classified as a kind of DBR (distributed Bragg reflector) (see M. Yamanishi et. al, "GaAs Acounstic Distributed Feedback Lasers" Jpn J. Appl. Phys. , Suppl. 18-1, page 355, 1979) These lasers have comparatively stable wavelengths. The ADFB laser generates a surface acoustic wave (SAW) such as to be orthogonal to the diffraction grating provided within the DBR laser, and forms an optical ring resonator based on Bragg diffraction which requires the diffraction grating which is incorporated on the chip, and the surface acoustic wave. When sweeping the wavelength of the SAW, a resonator wavelength of the ring resonator varies, thereby making it possible to sweep the oscillation wavelength.

In this embodiment, the oscillation wavelength falls within a zone of 1560 nm. The DFB laser, the DBR laser and the ADFB laser , which individually include a lengthy resonator have advantages in which the oscillation spectrum is narrow, and the spectrum has good purity. Where a variable wavelength range of single ADFB laser is insufficient, a plurality of ADFB lasers (e.g. VL1s to VL3s) as shown in FIG. 4 may be used, whereby it is feasible to perform a change over operation with the aid of an optical switch or a light wave synthesizer. Namely, the fluxes of output light from laser diodes VL1s to VL3s are inputted (with the returning light being acted upon by isolators IS2s) to the optical switch OS1s, in which place the light having a desired variable wavelength range is selected. The fluxes of output light from switch OS1s are partially reflected on half mirror HM3s and are then inputted to element OA2s.

The output light from element OA2s is inputted to shifter 23s wherein light is applied to modulator UM1s, thereby outputting Bragg's s-dimensional diffracted light. Assume that the reference frequency of the signal applied from a reference frequency source, such as a crystal oscillator, is $\omega_5$, and that the optical frequency of diffracted light shifts is $s\omega_5$.

The output light from shifter 23s strikes multiplier 24s and a secondary higher harmonic wave of the input light is outputted at the light waveguide path NLs. A tunable laser diode output of 1560 nm is inputted through photo amplifier OA2s, and 780 nm of a secondary higher harmonic wave is outputted. As a waveguide path NLs, there is used a slab light waveguide path having a quadruple layer of air-$TiO_2$-ZnS-glass in which a non-linear thin film of ZnS and a linear thin film of $TiO_2$ are used in order that non-linear effects are produced with high efficiency. In this embodiment, the secondary higher harmonic wave is utilized, however, discretionary n-dimensional higher harmonic wave may also be used.

The output light from multiplier 24s is amplified by amplifier element OA3s. Thereafter, as explained before, at half mirror HM2s output light from multiplier 24s is, as the feedback light, brought into confluence with output light emitted from source 1s.

In the above operation, optical frequency $\omega_0$ of output light from loop 2s is expressed as $$\omega_0 = (\omega_s \pm \omega_3)/n \pm s\omega_5$$

(however, the symbols are not in the same order). In this embodiment, however, the optical frequency multiple n is 2. That is, $\omega_0$ is, at the predetermined ratio of n, locked to optical frequency $\omega_s$ which assumes high accuracy and high stability at the absolute wavelength, and comes to have an offset of an arbitrary frequency $\omega_3/n$ or $\omega_5$. If $\omega_3$ or $\omega_5$ is swept, it is possible to realize highly accurate sweeping of optical frequency. Since $\omega_3$ and $\omega_5$ are electrical signals, high accuracy and high stability can be readily obtained.

The output light from loop 2s is inputted to member 3s and is amplitude modulated by means of amplitude modulator AM1s. It is further modulated in phase by a phase modulator PM1s and is then varied with respect to the direction of polarization by a polarization modulator LM1s. After output light from modulator 3s has been amplified by means of photo amplifier element OA4s of photo amplifier member 4s, the thus amplified output becomes the output of the synthesizer.

In the FIG. 4 embodiment, elements OA1 to OA4s comprise a GaAlAs laser (780 nm zone) and an InGaAsP laser (1500 nm zone), and the following types may be used.

(A) A Fabry-Perot cavity type amplifier wherein a bias electric current in the vicinity of an oscillation threshold is made to flow, and signal light is rendered incident upon the laser diode, thereby effecting linear photo amplification by inductive release.

(B) An injection locking amplifier wherein the signal light is made to strike upon the laser diode which goes on oscillating, thereby controlling the optical frequency and phase of the oscillating light.

(C) A travelling wave type amplifier wherein both end surfaces of the laser diode chip is non-reflection coated, and the photo amplification is performed only by the transmission of signal light.

In the FIG. 4 embodiment, the positions of shifter 23s and multiplier 24s may be interchanged and frequency $\omega_0$ of loutput light from loop 2s may be given as $$\omega_0 = (\omega_s \pm \omega_3 \pm s\omega_5)/n$$

In phase locked loop 2s, both mixers MX1s and shifter 23s are designed for adding offset frequencies and any one of them may be omitted.

Moreover, in loop 2s, assume the multiple n to be 1, then it is feasible to omit multipler 24s.

In the FIG. 4 embodiment, the absorption beams of Rb or Cs are used in the cell CL1s of source 1s. The absorption medium is not confined to Cs or Rb, and may , instead be , $NH_3$ or $H_2O$. The discretionary absorption beams (1500 nm zone) of $NH_3$ or $H_2O$ are highly accurate and stable at the absolute wavelength. In such a case multipler 24s may also be omitted. It is feasible to stabilize the wavelength by using a well known Fabry-Perot resonator as a wavelength detector. However, the method of utilizing the aforementioned absorption beams that are standard in terms of quantum is superior in property.

The tunable laser diodes VL1s to VL3s are not limited to the ADFB type laser used in FIG. 4, but may also be of a type wherein an external resonator which adopts the diffraction grating is added to the outside of the laser diode chip, the diffraction grating being made to rotate, and a variable wavelength is obtained by making the most of its wavelength selectivity. The narrow spectrum is a characteristic of the external resonator type laser diode.

Figure 7:
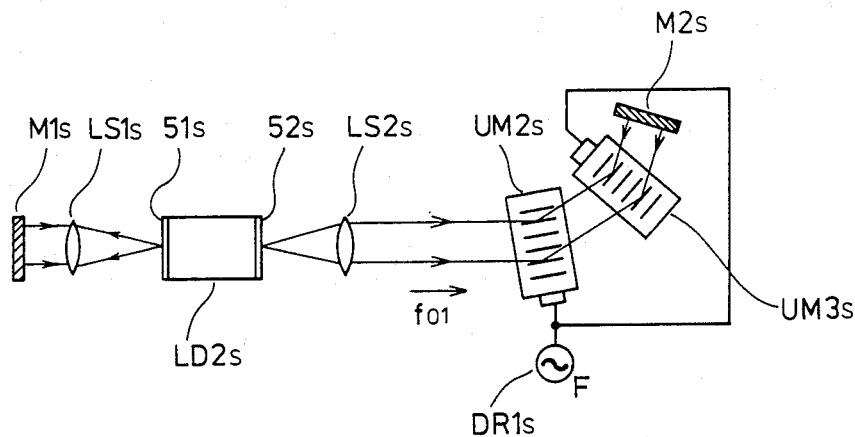
FIGS. 7, 9, 10, and 11 are explanatory views depicting other illustrative examples of the tunable laser diode of FIG. 4.

Furthermore, as the tunable laser diode VL1s to VL3s, wavelength selective type elements , as shown in FIG. 7, may be incorporated in the resonator . The FIG. 7 arrangement comprises a semiconductor laser LD2s; non-reflection coated members 51s, 52s provided at both ends of laser LD2s; lens LS1s which causes beams of light emerging from member 51s to become parallel; mirror M1s which reflects back light transmitted through lens LS1s; lens LS2s which causes beams of light emerging from non-reflection member 52s to become parallel; a first acousto-optical modulator UM2s to which is supplied light passing through lense LS2s; a second ultrasonic modulator UM3s upon which light emerging from modulator UM2 strikes; mirror M2s which reflects back light emerging from ultrasonic modulator UM3s; oscillator DR1s for exciting modulators UM2s, UM3s at a frequency F.

Figure 8:
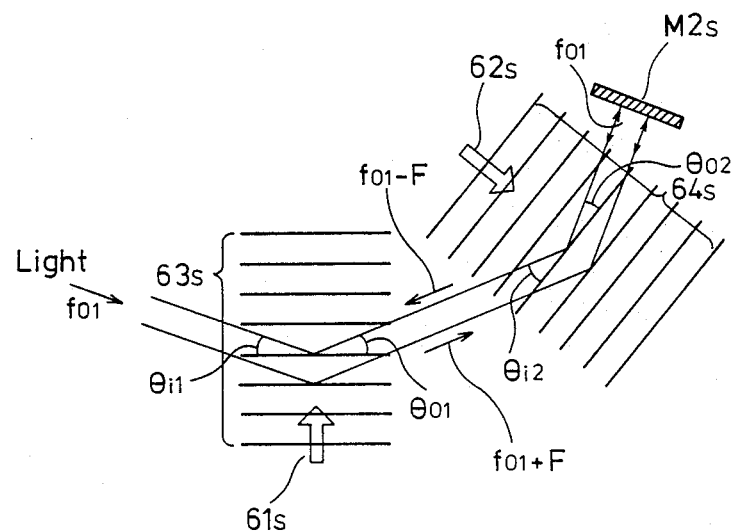
FIG. 8 is an explanatory view depicting operation of the arrangement of FIG. 7.

FIG. 8 shows the wavelength selective operation and the frequency sweeping operation of modulators UM2s, UM3s of FIG. 7. Light emerging from member 51s of laser LD2s passes through lens LS1s where they are made parallel, and are then reflected back by mirror M1s. The reflected light then travels back through the previous light path and falls upon laser LD2s once again. The light emerging from member 52s has a frequency $f_{01}$ and is made parallel by lens LS2s, and strikes modulator UM2s. Thus, taking the diffractive conditions into consideration, the following formula (1) is established with respect to incident angle $\theta_{i1}$ to a diffraction grating 63s which is produced by an ultrasonic signal 61s, the emergent angle $\theta_{o1}$ which is to be made after the diffraction, the wavelength $\lambda_o$ of light and the wavelength $\Lambda_o$ of the ultrasonic signal.

$$\sin\theta_{i1} + \sin\theta_{o1} = \lambda_o/\Lambda_o \qquad (1)$$

Namely, the wavelength $\lambda_o$ of light passing through such a light path as to satisfy the specified incident angle $\theta_{i1}$ and the emergent angle $\theta_{o1}$ is varied in proportion to the wavelength $\Lambda_o$ of the ultrasonic signal changes. The emergent light is subjected to Doppler shift caused by the ultrasonic signal. In this case, since it is +1-dimensional diffraction light ( the direction of ultrasonic signal is the same as the diffracted direction), its frequency comes to $f_{o1}+F$. The emergent light from modulator UM2s is again diffracted in modulator UM3s.

As in the prior case, a formula (2) is established in regard to incident angle $\theta_{i2}$ to a diffraction grating 64s which is generated by ultrasonic signal 62s, the emergent angle $\theta_{o2}$, that is to be made are after diffraction, the wavelength $\lambda_o$ of light and the wavelength $\Lambda_o$ of the ultrasonic signal.

$$\sin\theta_{i2} + \sin\theta_{o2} = \lambda_o/\Lambda_o \qquad (2)$$

In formula (2), however, a variation of $\lambda_o$, which is caused by Doppler shift of modulator UM2, is so small that it does not deserve consideration. As contrasted with the case in connection with modulator UM2s, the relation between a travelling wave 62s of the ultrasonic signal and the diffraction light is reversed, that is, it becomes −1-dimensional diffraction light and hence the amount of Doppler 1shift comes to −F, whereby the frequency of the memergent light of modulator UM3s is expressed as $f_{o1}+F-F=f_{o1}$.

The emergent light from modulator UM3s is reflected by mirror M2s, travels back through the previous light path, and then strikes laser LD2 once again. On the occasion of its travel back, the frequency of the emergent light from modulator UM3s becomes $f_{o1}-F$ by virtue of the Doppler shift, while the frequency of the emergent light from modulator UM2s is $f_{o1}-F+F=f_{o1}$. Namely, it reverts to the original frequency $f_{o1}$ so as to return to laser LD2s, whereby resonant state continues. In order to enhance diffraction efficiency, the Bragg incidence condition is satisfied, and when the wavelength of ultrasonic signal is $\Lambda_o$, the following expression becomes valid in connection with the incident angle $O_{i1}$, emergent angle $\theta_{o1}$, incident angle $\theta_{i2}$ and emergent angle $\theta_{o2}$.

$$\theta_{i1} = \theta_{o1} = \theta_{i2} = \theta_{o2}$$

If wavelength $\Lambda_o$ of ultrasonic signal is varied in such an arrangement, wavelength $\lambda_o$ of light meets $\theta_{i1}$, $\theta_{o1}$, $\theta_{i2}$ and $\theta_{o2}$ will be swept so that it is express as follows $$\sin\theta_{i1} + \sin\theta_{o1} = (\lambda_o + \Delta\lambda)/(\Lambda_o + \Delta\Lambda)$$

Figure 9:
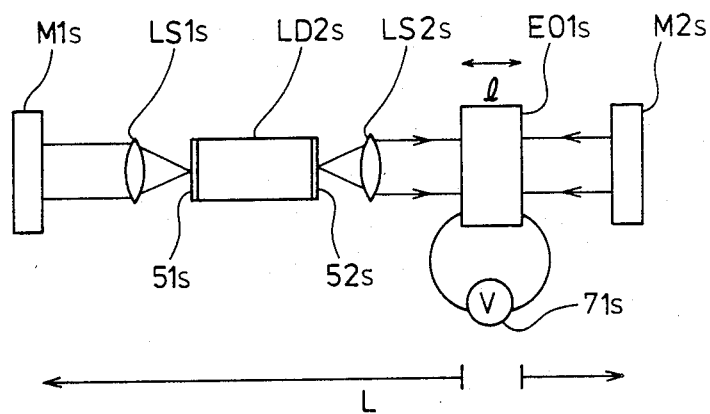

Laser diodes VL1s to VL3s may involve a type characterized such that an element capable of controlling refractive index is, as illustrated in FIG. 9, incorporated in the resonator. Description is omitted where the same elements have the same symbols.

The FIG. 9 arrangement comprises an electro-optical element ED1s comprising LiNbO3 (niobium acid lithium) or the like, and on both surfaces thereof are coated with non-reflection material to receive output light from lens LS2s; a power source 71s for controlling element EO1s. After the light emerging from laser LD2s has passed through lens LS2s and is parallel, the light is transmitted through element EO1s and is reflected back on mirror M2s. Thereafter, the light travels back via the previous light path, and strikes laser LD2 once again. As a result it is feasible to realize a resonator between mirror M1s and mirror M2s. Assume that the distance which eliminates the length 1 along the light path of element EO1s disposed between mirror M1s and M2s is L and that the refractive index of element EO1s is n, and the light velocity is c, and the integer is p, then the oscillation frequency $f_{o2}$ is $$f_{o2} = p \cdot c/2(L + n(V)l) \qquad (3)$$

The intensity of an electric field on element EO1s is varied by the output from power source 71s, whereby it is possible to change the refractive index n of element EO1s. Thus, oscillation frequency $f_{o2}$ can be swept.

Figure 10:
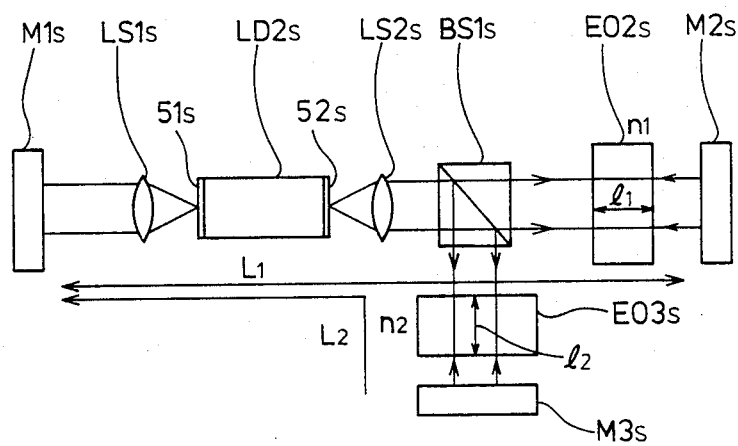

FIG. 10 differs from FIG. 9 in that the arrangement forms a double resonator. The same components as in FIG. 9 are marked with the same symbols and are not discussed hereat. The different components comprise beam splitter BS1s for bidirectionally splitting light emerging from lens LS2s; electro-optical element EO2s upon which light transmitted through beam splitter BS1 strikes; mirror M2s for reflecting back light emerging from element EO2s; electro-optical element EO3s for operating on light reflected by beam splitter BS1s; and mirror M3s for reflecting emergent light from element EO3s. Assume that the lengths of elements EO2s and EO3s which extend along the light path are $l_1$, $l_2$, respectively, and that refractive indexes thereof are $n_1$, $n_2$, and that the distance exclusive of length $l_1$ extending along the light path between mirrors M1s, M2s is $L_1$, and that the distance exclusive of length $l_2$ extending along the light path between mirrors M1s, M3s is $L_2$, and that the integer is q, then oscillation frequency $f_{o3}$ is $$f_{o3} = q \cdot c/2|(L_1 + n_1(V_1)l_1) - (L_2 + n_2(V_2)l_2)| \qquad (4)$$

Since the denominator of formula (4) can be made smaller than that of formula (3), it is feasible to make the variable range of the oscillation frequency larger than that of the FIG. 9 arrangement.

Figure 11:
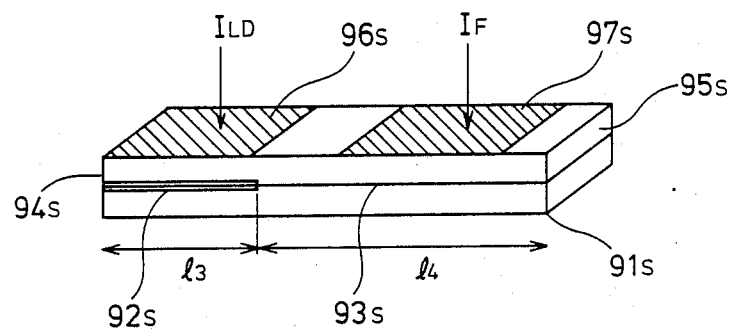

FIG. 11 depicts the tunable laser of FIG. 9 arranged on a chip in an integrated formation. The arrangement comprises a laser diode 91s formed on GaAlAs, InGaAsP, and the like; a photo amplifying member 92s provided at the joined portion of laser diode 91s; waveguide path type external resonator 93s; mirrors 94s and 95s placed at both ends of laser diode 91s; electrode 96s provided on the surface of laser diode 91s so that it corresponds to photo amplifier 92s; and an electrode 97s provided on the surface of laser didoe 91s so that it corresponds to waveguide path type external resonator 93s. The joined portion is supplied via electrode 96s with an electric current $I_{LD}$ so as to generate laser beams in member 92s; and an electric current $I_F$ is made to flow via electrode 97s into resonator 93s, thereby sweeping the oscillation frequency by varying the refractive index of the resonator 93s.

Assume that the lengths extending along the joined portion of resonator 93s are $l_3$, $l_4$, respectively, that the refractive indexes thereof are $n_3$, $n_4$, and that the integer is r, then the oscillation frequency $f_{o4}$ is $$f_{o4} = r \cdot c / 2(n_3 l_3 + n_4 (I_F) l_4) \qquad (5)$$

Returning to FIG. 4, a W-Ni (tungsten-nickel) point contact diode and Josephson element can be applied to the optical heterodyne detecting member 21s. These elements of member 21s perform multiplying operation and a mixing operation and hence it is possible to concurrently input $\omega_s$, $\omega_1$, $\omega_3$, thereby making unnecessary mixer MX1s of FIG. 4. In this case the outputs of these elements, viz., input signals of the optical frequency modulation circuit FCs come to have the relation $\omega_4 = \omega_s - \omega_1 \pm m\omega_3$ (m is multiplying factor). The equation $\omega_4 = \omega_s - 2\omega_1 \pm m\omega_3$ is also possible. Such being the case, multiplier 24s is not required.

Figure 12:
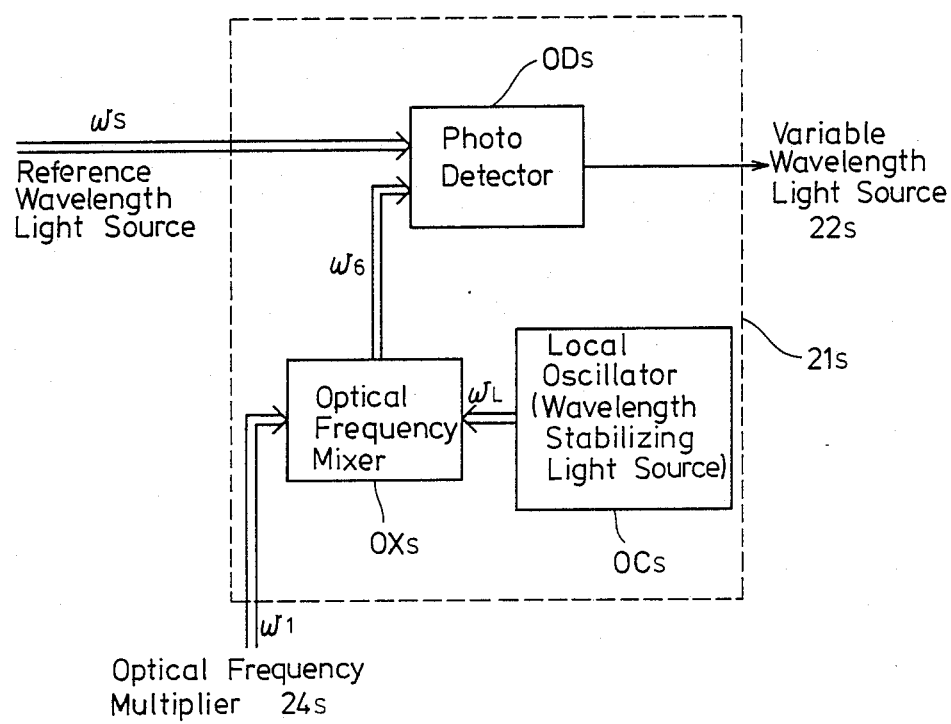
FIG. 12 is a block diagram depicting a partial variation of the embodiment of FIG. 4.

FIG. 12 depicts the optical heterodyne detecting member 21s comprising a local oscillator OCs of an optical output frequency $\omega_L$ which utilizes a second wavelength stabilizing light source; an optical frequency mixer OXs to which light output from local oscillator OCs and multiplier 24s, via photo amplifying element OA3s, are inputted (This mixerOXs uses a non-linear optical crystal); and a photo detector PDs, comprising a PIN photodiode, avalanche photo diode, or the like, for inputting optical output from mixer OXs and output light from light source 1s and for outputting the resulting signals to light source 22s. According to such an arangement, by virtue of the non-linear effect,- the optical output frequency $\omega_6$ of mixer OXs is express as $\omega_6 = \omega_1 + \omega_L$. In the FIG. 4 embodiment, there is limitatively obtained only $\omega_1$, which is to be determined by $\omega_s = \omega_1 = n\omega_o$ (apart from the offset frequency) by means of the multiplier. In the FIG. 12 arrangement, however, it is possible to output light having many different wavelengths. For example, when the wavelength $\lambda_s$ of $\omega_s$ is selected so as to be 780 nm by using absorption beams of Rb and when the wavelength $\lambda_L$ of $\omega_L$ is selected so as to be 852 nm by using absorption beams of Cs, since there is the relation $1/\lambda_s = 1/\lambda_1 + 1/\lambda_L$ between the respective wavelength $\lambda_s$, $\lambda_1$, $\lambda_L$ of $\omega_s$, $\omega_1$, $\omega L$ because the relation $\omega_s = \omega_6$ that is valid in time of a feedback loop balance, then the equation $\lambda_1 = 9230$ nm is obtained.

Figure 13:
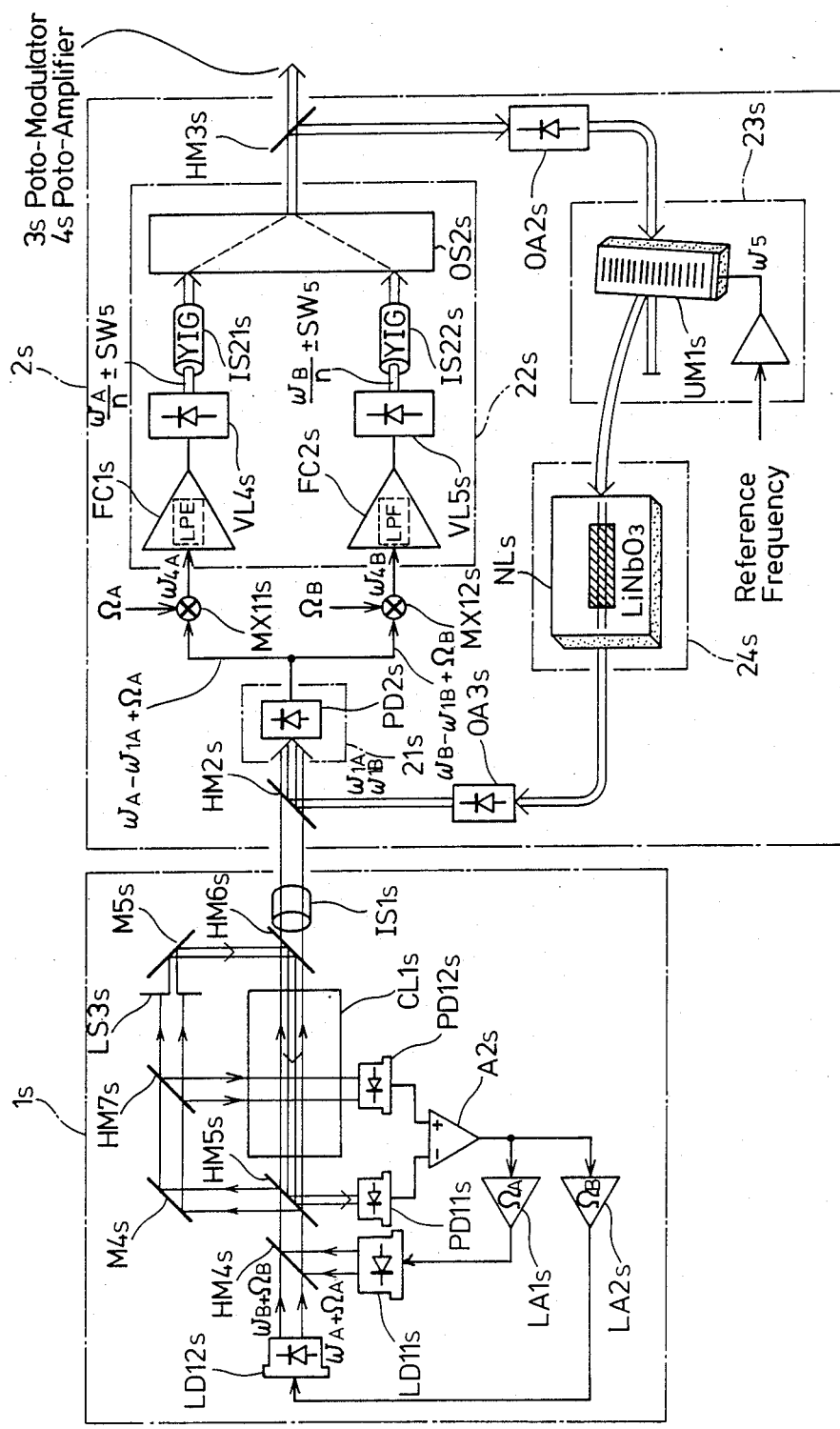
FIG. 13 is a block diagram of a third illustrative embodiment of the invention.

FIG. 13 depicts a third illustrative embodiment which is capable of simultaneously outputting two optical frequencies, and which use as a reference wavelength light source 1s, a two wavelength stabilizing laser diode which utilizes saturation absorption and which comprises laser diodes LD11s, LD12s which generate laser outputs having different wavelengths; half mirror HM4s for causing the outputs from laser diodes LD11s, LD12s to become confluent with each other; a half mirror HM5s for bidirectionally splitting output light from half mirror HM4s; an absorption cell CL1s similar to that depicted in FIG. 4, for operating on light transmitted through half mirror HM5s; a half mirror HM6s upon which light emerging from cell CL1s strikes; a returning light preventing isolator IS1s through which output light from half mirror HM6s passes; a mirror M4s which reflects light reflected by half mirror HM5s; half mirror HM7s which receives reflected light from mirror M4s; a diaphragm LS3s for receiving light transmitted through half mirror HM7s; mirror M5s upon which output light from diaphragm LS3s strikes; photo detector PD11s for receiving output light from mirror M5s through the intermediary of half mirror HM6s, absorption cell CL1s and half mirror HM5s; a photodetector PD12s for receiving light reflected by half mirror MH7s via cell CL1s; differential amplifier A2s for computing the difference between an electrical output from photodetector PD11s and an electrical coutput from photodetector PH12s; lock in amplifiers LA1s, LA2s comprising laser diode driving circuits, for inputting the outputs from differential amplifier A2s so as to output them to laser diodes LD11s, LD12s, respectively; and a returning light preventing isolator IS1s through which the output light from half mirror HM6s passes.

AS for loop 2s, certain components which are different from those shown in FIG. 4 will be discussed. The loop 2s comprises mixers MS11s, MX12s for inputting an electrical output from detector 21s and FM modulating frequencies $\Omega_A$, $\Omega_B$. Variable wavelength light source 22s comprises optical frequency modulation circuits FC1s, FC2s which have LPF properties, for inputting the outputs from mixers MX11s, MX12s; tunable laser diodes VL4s, VL5s having oscillation frequencies which are controlled by the outputs from circuits FC1s, FC2s; returning light preventing isolators IS21s, IS22s through which light from tunable diodes VL4s, VL5s are operated on; and a light wave synthesizer OS2s for inputting and synthesizing the outputs from isolators IS21s, IS22s. The other components are similar to the FIG. 4 arrangement.

The operation of the FIG. 13 embodiment is as follows. Providing that the outputs from laser diodes LD11s, LD12s are $\omega_A + \Omega_A$, $\omega_B + \omega_B$, the two fluxes of light are snychronized in half mirror HM4s and are bidirectionally split by half mirror HM5s. The light that is transmitted through half mirror HM5s passes through, as saturated light, absorption cell CL1s. Thereafter, the light passes through half mirror HM6s and is then outputted via isolator IS1s to optical phase locked loop 2s. On the other hand, the light reflected by half mirror HM5s is further reflected by mirror M4s and is then split bidirectionally by half mirror HM7s. The light passing through half mirror HM7s is diaphragmed by diaphragm LS3s and is reflected by half mirror HM6s. The thus reflected light becomes the probe light which is much narrower than the saturation light and is supplied to absorption cell CL1s. Then, the light is subjected to absorption by cell CL1s accompanied by a sharp cavity formed in Doppler expansion by operation of the saturation effect,and the light is then reflected by half mirror HM5s and strikes detector PD11s. The light that is reflected by half mirror HM7s, serving as reference light, falls from the perpendicular direction (i.e. in the drawing figure) upon absorption cell CL1s and then undergoes absorption coupled with Doppler expansion. Subsequently, the light is supplied to detector PD12s. Differential amplifier A2s computes the difference between electric outputs from detectors PD11s, and PD12s, and inputs the difference signal output to lock in amplifiers LA1s, LA2s.

With $\Omega_A$ serving as the reference frequency, lock in amplifier LA1s effects synchronizing rectification, detects $\Omega_A$ components alone and controls laser diode LD11s, thereby locking it, for example, in absorption beams of F=1 of FIG. 5, to the center of any one of absorption beams r to t shown in FIG. 6 which are respectively possessed of an infinitesimal structure, the absorption beams being hidden by the Doppler shift.

Similarly, with $\Omega_B$ serving as the reference frequency, lock in amplifier LA2s effects synchronizing rectification, detects $\Omega_B$ components alone and controls laser diode LD12s, thereby locking it, for example, in the absorption beam of F=2 of FIG. 5, to the center of any one of the absorption beams o to q in FIG. 6, which individually have the infinitesimal structures and are concealed by the Doppler shift. There is thus obtained a two wavelength stabilizing light source having oscillation frequencies of $\omega_A+\Omega_A$, $\omega_B+\Omega_B$. Two wavelength reference light output supplied from source 1s is inputted to loop 2s and is heterodyne detected together with output from multiplier 24s thouugh heterodyne detector 21s. As a result, there are obtained detecting outputs having the following frequencies $|\omega_A-\omega_{1A}+\Omega_A|$, $|\omega_B-\omega_{1B}+\Omega_B|$, $|\omega_A-\omega_B+\Omega_A+\Omega_B|$, $|\omega_A-\omega_{1B}+\Omega_A|$, $|\omega_B-\omega_{1A}+\Omega_B|$ (wherein $\omega_{1A}$, $\omega_{1B}$ are the two frequencies of outputs from multiplier 24s).

During the operation of loop 2s, there are the relations $\omega_A \approx \omega_{1A}$, $\omega_B \approx \omega_{1B}$. Since $\Omega_A$, $\Omega_B$ are several KHz and the difference between $\omega_A$ and $\omega B$ is, as shown in FIG. 6, 6.8 GHz, it is feasible to take out frequency components of $|\omega_A-\omega_{1A}+\Omega_A|$, $|\omega_B-\omega_{1B}+\Omega_B|$ by imparting a low pass property to the detector PD2s. The two mixers MX11s, MX12s mix the output electrical signals from detecting member 21s with the input signals of frequencies $\Omega_A$, and $\Omega_B$, thereby generating output signals $\omega_{4A}=|\omega_A-\omega_{1A}|$, $4B=|\omega_B-\omega_{1B}|$.

In light source 22s, two FM circuits FC1s, FC2s respectively, control frequency of diodes VL4s, VL5s so that the output signals $\omega_{4A}$, $\omega_{4B}$ from mixers MX11s, MX12s become zero. The light outputs from diodes VL4s, VL5s fall, via isolators IS21s, IS22s, upon light wave synthesizer OS2s in which the outputs are synthesized, thereby generating light outputs having two optical frequencies of $\omega_A/n \pm s\omega_5$, $\omega_B/n \pm s\omega_5$. These outputs are not FM moduated at frequencies $\Omega_A$, $\Omega_B$.

The two frequencies discussed in FIG. 13 embodiment are not limiting, e.g. a plurality of other frequencies are also applicable.

In the FIG. 13 embodiment, the reference wavelength source 1s utilizes the saturated absorption method. However, the linear absorption method may also be used to lock the two wavelengths to the center of the absorption of F=1 and F=2 shown in FIG. 5(A). In this case, the incident light to cell CL1s is arranged to be two fluxes of light and the two lock in amplifiers are used at the reference wavelength light source 1s depicted in FIG. 4.

It can be observed through FIG. 13 that modulator UM1s alone is used for the sake of offset and sweeping of optical frequencies. However, $\omega_{3A}+\Omega_A$, $\omega_{3B}+\Omega_B$ are available which are sought by adding shift frequencies $\omega_{3A}$, $\omega_{3B}$ thereto instead of input frequencies $\Omega_A$, $\Omega_B$ of mixers MX11s, MX12s. In this case, the two optical frequencies of outputs become $(\omega_A \pm \omega_{3A})/n \pm s\omega_5$ and $(\omega_B \pm \omega_{3B})/n \pm s\omega_5$, respectively. Hence, it is possible to simultaneously sweep the two frequencies at $\omega_5$ and to separately sweep the two frequencies by sweeping $\omega_{3A}$ and $\omega_{3B}$, respectively.

As shown in each of the embodiments so far described, the synthesizer/sweeper of the invention is capable of locking the light output thereof to the absorption beam of Rb or Cs at the absolute wavelength with high accuracy and high stability and of obtaining a quantum standard (conventional frequency standard uses microwave resonance of Cs(9 GHz) or Rb(6 GHz)) having stability of 10−12 or more.

Since an ADFB laser including a lengthy resonator and an external resonator type laser diode are used as the tunable laser diode, the Q of the resonator is high, and the width of oscillation spectrum can be diminished.

Since there is adopted the principle of optical phase locked loop, highly accurate sweeping of optical frequency can be performed.

By using absorption beams of Rb (780 nm, 795 nm) and the multiplication method as well, it is feasible to output, with high accuracy and high stability, light of a 1500 nm zone which creates the least photo transmission loss among the photo communication fibers. This enables the invention to have high commercial marketability. Furthermore, many kinds of optical frequencies can be outputted with the arrangement of FIG. 12. In addition, it is possible to concurrently output a plurality of optical frequencies and to sweep them separately due to the arrangement of FIG. 13.

As in the case of the embodiment of FIG. 13, it is feasible to remove unnecessary FM modulation components from the light outputs. Even in the case of FIG. 4, if $\omega_3'=\omega_3+\Omega$ (wherein $\Omega$ is the FM modulation frequency when using the lock in amplifer) is inputted to mixer MX1s, such removal will likewise be possible.

Figure 14:
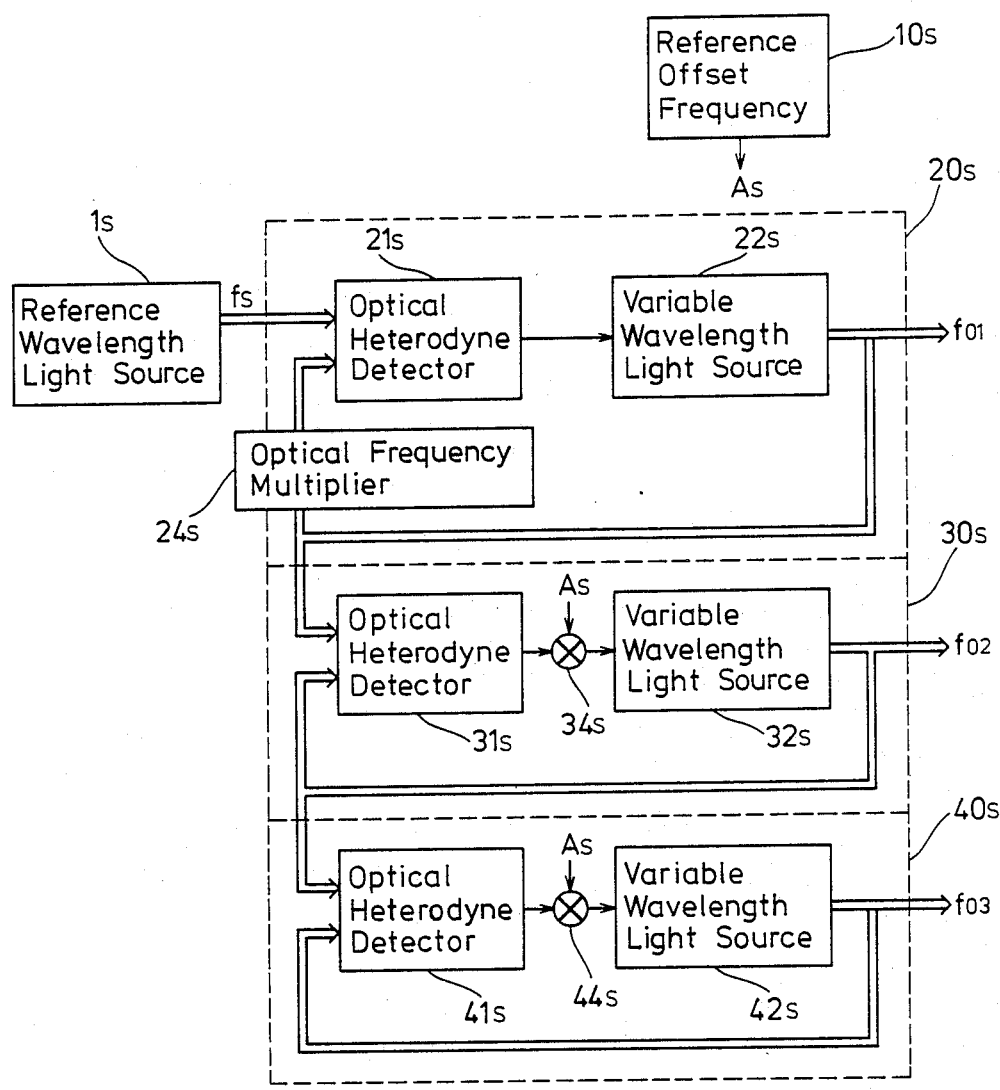
FIG. 14. is a block diagram depicting a fourth illustrative embodiment of the invention, wherein multiple sources of light are provided.

FIG. 14 depicts a fourth illustrative embodiment which serves as an optical frequency multiple light source. The same components as those in FIG. 4 are marked with the same symbols. The multiple light source comprises a reference wavelength light source 1s in which the wavelength is stabilized; an optical phase locked loop 20s for inputting output light from source 1s, a second stage optical phase locked 30s for inputting the output light from loop 20s; and a third stage optical phase locked loop 40s for inputting output light from loop 30s.

Loop 20s comprises an optical heterodyne detecting member 21s comprising a PIN photodiode, an avalanche photodiode or the like, which receives output at one input side from source 1s; a variable wavelength light source 22s wherein an oscillation wavelength of the output is controlled by electric output from detecting member 21s; and an optical frequency multiplying member 24s which comprises a light waveguide path formed of a non-linear material and which multiplies a frequency of the output from source 22s and at the same time supplies output thereof to member 21s at its input from the other side.

Loops 30s and 40s each comprises optical heterodyne detecting members 31s,41s (which are similar to 21s) which receive output light, as input at one side, from loop 20s,30s; mixers 34s,44s which receive electric outputs from respective members 31s,41s as input to the other side; a reference offset frequency circuit 10s (comprising an oscillator for generating electric output with given frequency) which supplies output signals As to each of mixers 34s, 44s as inputs from the other side; and variable length light sources 32s,42s (similar to light source 22s) which receives outputs from mixers 34s,44s and supplies part of the output to detecting members 31s, 41s as the input thereof at the other side.

The operation of the FIG. 14 embodiment is as follows. When output from source 1s is inputted to loop 20s, loop 20s controls (i.e. locks) its wavelength of its output such as to correspond to the oscillation wavelength of light source 1s. Output from source 22s enters multiplier 24s and outputs a secondary higher harmonic wave of input light on a light waveguide path formed of non-linear material. Detector 21s outputs an electric signal (i.e. beat signal) having a frequency equivalent to a difference between the frequency of the output from source 1s and that of the output from multiplier 24s. Source 22s controls the frequency of output light so that the frequency of the electrical signal becomes zero. Namely, the output frequency of source 1s is equalized to that of multiplier 24s. Taking the results thus far obtained into consideration, let the output frequency of light from source 1s be fs, the the output frequency $fo_1$ of light from source 22s can be expressed as $$fo_1 = (\tfrac{1}{2})f_s \qquad (6)$$

So far as this embodimentiis concerned, the secondary higher harmonic wave is utilized in the multipler 24s. However, when an arbitrary n-dimensional higher harmonic wave is used it is feasible to obtain an output frequency reduced by a factor of n.

Since the reference offset frequency fos of circuit 10s is added to the output frequency of detector 31s, the frequency of the output light from source 32s in loop 30s is given by $$\begin{aligned} fo_2 &= fo_1 + fos \\ &= (1/2)fs + fos \end{aligned} \qquad (7)$$

Similarly, the frequency of the output light from source 42s in loop 40s is expressed as $$\begin{aligned} fo_3 &= fo_2 + fos \\ &= (1/2)fs + 2fos \end{aligned} \qquad (4)$$

Figure 15:
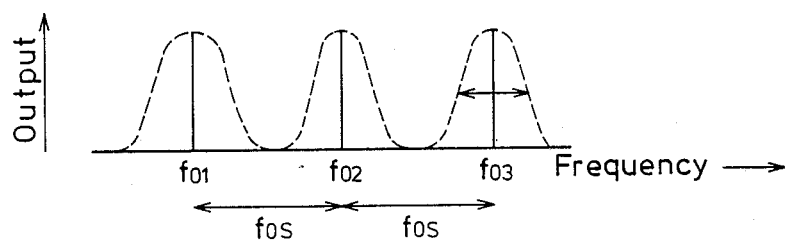
FIG. 15 is a diagram depicting a characteristic curve of a frequency spectrum of output light of the embodiment of FIG. 14.

Namely, as clarified in the diagram of FIG. 15, which shows the characteristic curve of frequency spectrum, it is possible to precisely generate light output having the frequency interval fos (e.g. 10 GHz) from the respective phase locked loops 20s, 30s, 40s.

According to the optical frequency multiple light source device of FIG. 14, it is practicable to control the reference light output thereof to the absorption beams of Rb at the absolute wavelength with high accuracy and high stability, thereby producing a highly accurate multiple light source.

Moreover, the respective frequency intervals can be controlled in a highly precise manner. In addition, as the respective frequency are narrow and stable, a multiple light source with high density can be realized. Also, since the external resonator type laser is used as the tunable laser diode, it is feasible to increase the effective length of the resonator and to reduce the width of oscillation spectrum.

The absorption wavelength of the $D_2$ line of Rb is 780 nm in light source 1s, and this numeric value is multiplied in loop 20s, thus obtaining 1560 nm. Consequently, light output is generated which accords with the 1500 nm zone of the optical fiber communication wavelength.

Accordingly, high density optical frequency multiple source communication is possible. Also, even when being utilized as a light source for highly accurate photo applied measuring device, considerably enhanced performance of measurement of length is advantageously obtained. Also, it is possible to vary the offset frequency by interposing an ultrasonic modulator between the outputs of the sources 32s, 42s and the inputs of detecting members 31s, 41s.

The multiple of multiplying member 24s may involve discretionary integers. Given the multiple is 1, the optical multiplier member 24s may be omitted. In this case, the respective frequencies of the output become $$fo_1 = fs$$

$$fo_2 = fs + fos$$

$$fo_3 = fs + 2fos$$

In this case, the first stage loop 20s is omitted. Instead the output from source 1s can be used as the first stage output.

In the FIG. 14 embodiment, the identical reference offset frequency fos is added to the optical phase locked lpop of each stage. However, a plurality of reference offset frequencies $fos_1$, $fos_2$ that are different from each other may be added thereto for each stage.

The phase locked loop is not confined to three stages shown. A plurality of stages may be used.

Figure 16:
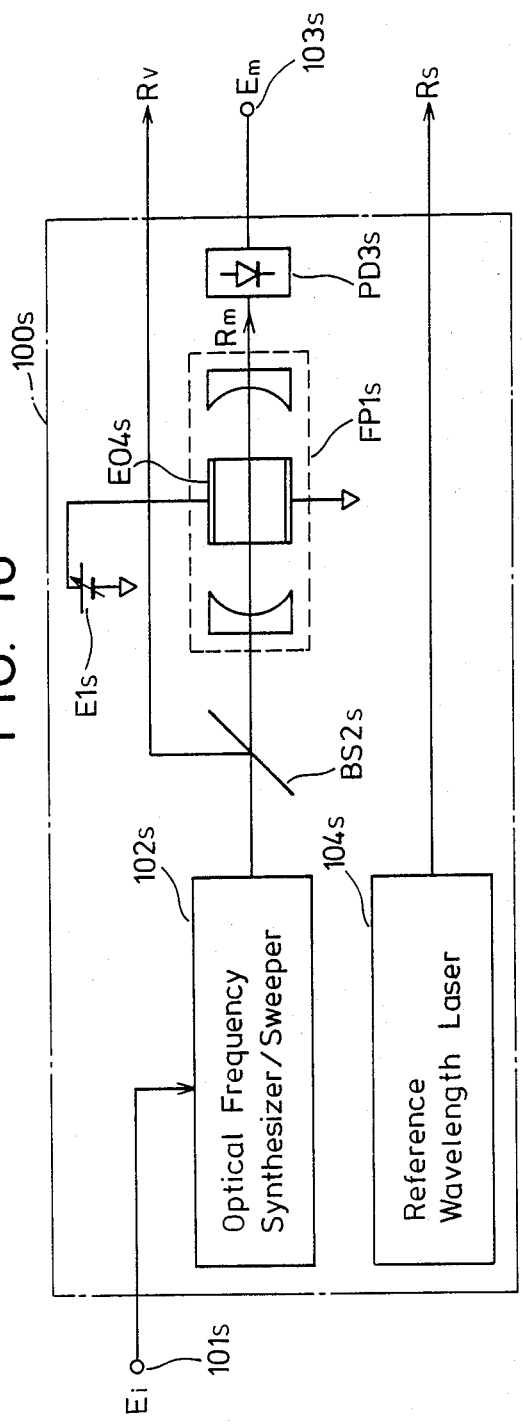
FIG. 16 is a block diagram depicting another example of the optical frequency/synthesizer/sweeper of the invention.

FIG. 16 describes a highly accurate marker attached variable wavelength light source which comprises a variable wavelength light source 100s; an input terminal 101s to which an input electrical signal Ei for controlling the wavelength is applied; an optical frequency synthesizer/sweeper 102s for inputting eleectrical signal Ei through the intermediary of the input terminal 101s; a beam splitter BS2s for bidirectionally splitting the output light from synthesizer/sweeper 102s; a resonator FP1s comprising a Fabry-Perot etalon for inputting light transmitted through beam splitter BS2s (this resonator constitutes a wavelength selection device); an electro-optical element EO4s provided on the optical axis within resonator FP1s; signal source E1s for driving element EO4s; light receiving element PD3s for receiving output from resonator FP1s and coverting it into an electrical signal; and a highly accurate and stable reference wavelength laser beam source 104s (similar to reference wavelength source of FIGS. 4, 14) for emitting output light with a specified wavelength.

Operation of the FIG. 16 embodiment is as follows. The synthesizer/sweeper 102 emits an output light having a wavelength corresponding to signal Ei that is applied through input terminal 101s. Part of the beams of output light are reflected by beam splitter BS2s and then becomes variable wavelength output light Rv, and the rest of the beams pass through beam splitter BS2s and are inputted to resonator FP1s. Resonator FP1s is capable of changing an equivalent resonator FP1s and is capable of changing an equivalent resonator length by action of element EO4s which is present on the light path. Thus, an output light Rm of resonator FP1s has a peak value at a wavelength interval corresponding to the output (i.e. voltage) of signal source E1s. Detector PD3s converts output light Rm into electrical signals, which are then outputted as a marker signal Em from terminal 103a.

Figure 17:
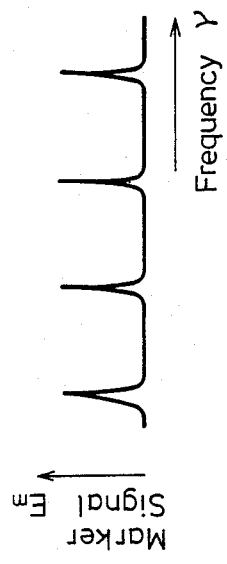
FIG. 17 is a time chart depicting operation of the arrangement of FIG. 16.

FIG. 17 is a spectrum chart wherein marker signal Em is shown in the frequency region. Reference wavelength laser light source 104s emits an output light Rs with a given wavelength within an output band of an synthesizer/sweeper 102s.

Figure 18:
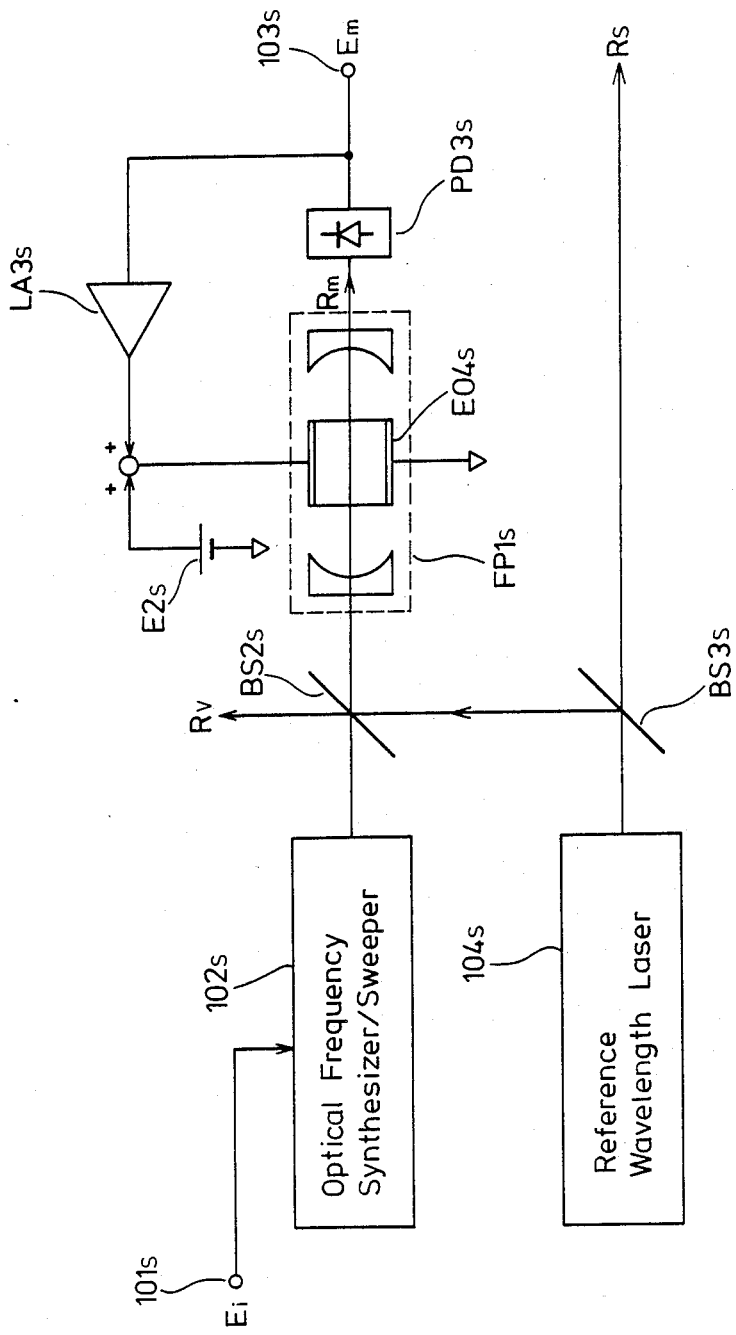
FIG. 18 is a block diagram depicting principal portions of a variation of the arrangement of FIG. 16.

FIG. 18 is a variation of the arrangement of FIG. 16. The same components as those of FIG. 16 are marked with the same symbols and are not discussed hereat.

The arrangement comprises a beam splitter BS3s for causing reflected light to fall on beam splitter BS2s, this beam splitter BS3s being provided on an output light path from reference wavelength laser light source 104s. A lock in amplifier LA3s inputs the output from light receiving element PD3s. A bias signal source E2s supplies bias signal to element EO4s, which is an electrooptical element. Part of beams of output light from source 104s is reflected by beam splitter BS3s and is then supplied via beam splitter BS2s to resonator FP1s. It is feasible to make the marker light accord with the reference wavelength by controlling resonator length of resonator FP1s so that the reference wavelength component reaches its maximum in a feedback loop including the lock in amplifier LA3s.

Figure 19:
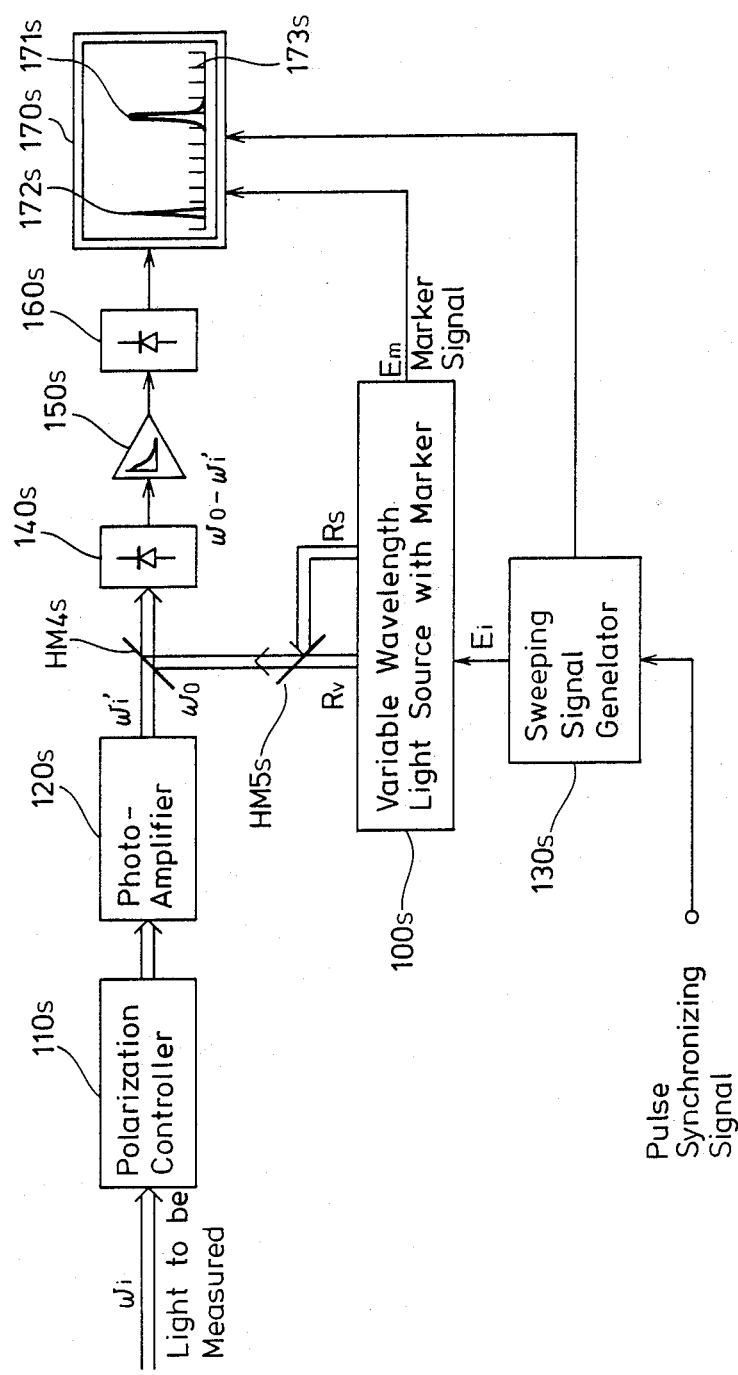
FIG. 19 is a block diagram depicting an optical spectrum analyzer demonstrating an example of a marker attached variable wavelength light source of FIG. 16 or FIG. 18.

FIG. 19 depicts an optical spectrum analyzer as one practical example of a marker attached variable wavelength light source which is illustrated in FIGS. 16,18. In FIG. 19, a belt like arrow head indicates flow of photo signal, and a solid line arrow head indicates flow of an electrical signal. The arrangement comprises a polarization controlling member 110s which makes use of a magneto-optical effect crystal (e.g. YIG, lead glass or the like) for receiving light to be measured; photo amplifying member 120s (similar to OA1s to OA4s in FIG. 4) for inputting the output light from member 110s; sweeping signal generator 130s; marker attached variable wavelength light source 100s wherein the frequency sweeping of optical frequency synthesizer/sweeper 102s is controlled by means of generator 130s; a half mirror HM5s for synthesizing a reference wavelength light Rs and a variable wavelength light Rv of the marker attached variable light source 100s; a half mirror HM4s for inputting the output from half mirror MH5s and from amplifier 120s; optical heterodyne detecting member 140s (comprising PIN diode, avalanche photodiode, or the like) for inputting output light from half mirror HM4s; filter member 150s which inputs electrical ouptut from detecting member 140s in order to amplify it and also has ban pass properties; a detecting member 160s for inputting electrical signals from filter member 150s; and a signal processing/display member 170s for inputting the electric output from detecting member 160s.

Operation of the FIG. 19 arrangement is as follows. When light with frequency $\omega_i$ that is to be measured falls upon the controlling member 110s, an impressed magnetic field is controlled by making the best use of rotating polarization of the magneto-optical effect crystal, whereby a polarized surface of the incident light is so controlled as to be identical with that of the emergent light from half mirror HM5s. After the light output from controlling member 110s has been amplified by amplifier 120s, it is synthesized with the output light having a frequency $\omega_o$ from source 100s by means of half mirror HM4s. Thereafter, the output from half mirror HM4s is converted into an electric signal with a frequency equal to the difference obtained by $\omega_o - \omega_i'$ (wherein $\omega_i' = \omega_i$) in detecting member 140s. Electric output from detecting member 140s partially passes through filter member 150s by virtue of its band pass properties and is then taken out as a power signal in detecting member 160s. Member 170s receives a signal as a frequency axial signal which is relative to the sweeping from signal generator 130s, and receives the electric output from detecting member 160s as a power signal. Member 170s spectrum displays a light 171s to be measured and a reference light 172s and simultaneously displays a marker 173s by receiving a marker signal outputted from light source 100s together with inputs from detector 160s and generator 130s.

Operational examples of the optical frequencies are as follows. The wavelength of the reference light Rs is 780 nm(the wavelength of the laser diode is locked to the absorption beams of Rb). The wavelength of variable wavelength light Ro is 780 nm±50 nm. The wavelength of $\omega_i$ is 780 nm±50 nm.

In FIG. 19 a pulse synchronizing signal is supplied to signal generator 130s so that the spectrum is measured with pulse light serving as the light to be measured. A trigger signal syncrhonized with the pulse light to be measured is inputted to generator 130s. Synchronized with this, the frequency of the variable wavelength light Rv of source 100s is swept in a stewise configuration. Simultaneously, signal corresponding to the step frequency is transmitted to member 170s. As a result, power spectrum of the frequency at one point is measured per pulse light, and it is possible to output the entire spectrum of the pulse light after the sweeping operation has been performed.

According to the FIG. 19 embodiment, frequency resolving power of the optical spectrum analyzer is determined both by spectrum width of the variable wavelength output light Rv of source 100s and by a band width of filter member 150s. The spectrum width of variable wavelength output Rv is determined by the synthesizer/sweeper 102s and hence it is feasible to obtain excellent frequency resolving power.

A band pass filter is used as the filter member 150s in the FIG. 19 arrangement. This type of filter is not limiting; for example, a low pass filter can also be used.

FIG. 20 depicts another example of a variable wavelength light source with a marker, showing a light source for a conventional optical spectrum analyzer (or spectroscope). A marker light output Rm of the marker attached variable wavelength light source 100s is reflected by mirror M6s and is combined with a reference wavelength light output Rs in beam splitter Bs3s, and is further combined with light to be measured in beam splitter BS4s. Thereupon, the thus combined marker light output is inputted to an optical spectrum analyzer 180s. The synchronizing signal transmitted from the optical spectry analyzer 180s becomes a wavelength variable input Ei of marker attached source 100s. With such a configuration, there appear spectrums of a light 181s to be measured, a reference light 182s and a marker light 183s, synchronized with the sweeping, on the visual display of optical spectrum analyzer 180s.

FIG. 21 depicts a further example of a marker attached variable wavelength light source. The variable wavelength output light Rv of marker attached light source 100s is rendered incident upon a substance 190s to be measured; and its output light is detected by means of a light receiving element PD4s, whereby the output is made to serve as a first Y-axis input $Y_1$ of an XY recorder 200s. The marker light output Rm and reference output Rs which are supplied from the marker attached light source 100s falls, via mirror M6s and beam splitter BS3s, upon light receiving element PD5s, and are then converted into electrical signals thereby to become a second Y-axis input $Y_2$ to an XY recorder 200s. The outputs of a lamp generator 210s become the wavelength variable input Ei supplied to light source 100s and become the X-axis input to XY recorder 200s. As a result, on XY recorder 200s are recorded a reference light 202s and a marker light 203s as well as a spectral property 201s.

In each of the embodiments of FIGS. 19,20,21, the reference light and marker light together with measurement data are displayed or recorded, so that the wavelength can readily be known.

Figure 22:
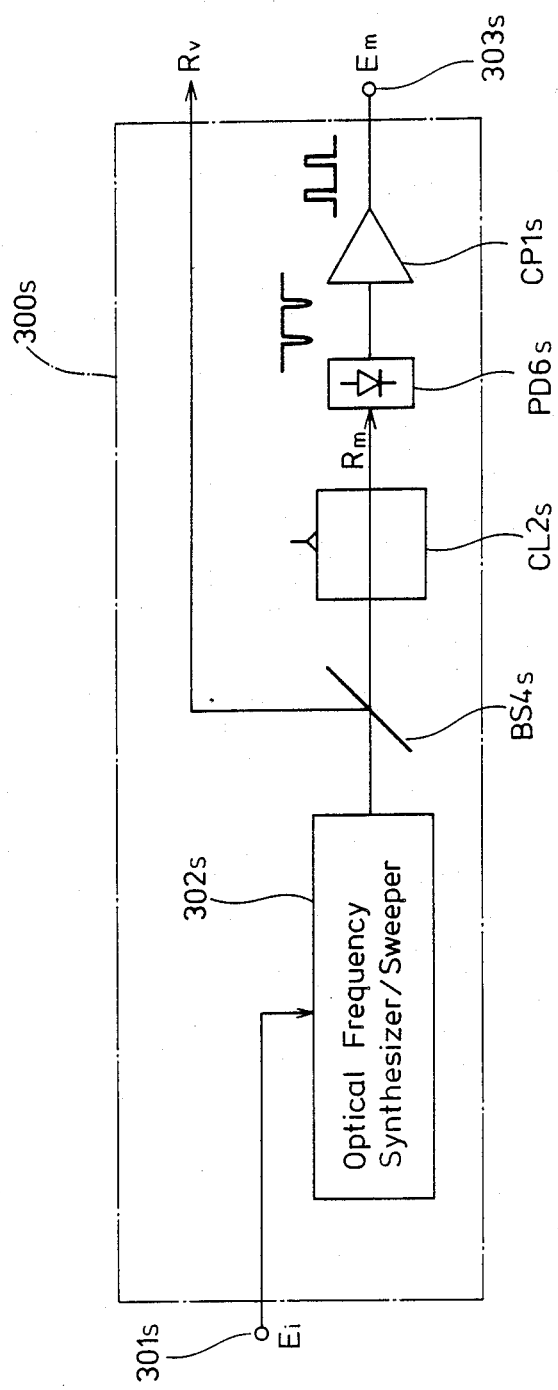
FIG. 22 is a block diagram depicting another example of the optical frequency synthesizer/sweeper of the invention, wherein a highly accurate marker attached variable wavelength light source is realized by using an absorption cell.

FIG. 22 depicts a highly accurate marker attached variable wavelength light source together with use of an absorption cell. The arrangement comprises a variable wavelength light source 300s; input terminal 301s to which input electrical signal Ei for controlling the wavelength is applied; an optical frequency synthesizer/sweeper 302s for inputting electrical signal Ei through input terminal 301s; a beam splitter BS4s for receiving output light from synthesizer/sweeper 302s and bidirectionally splitting the output ; an absorption cell CL2s which encloses a standard substance and receives output light from beam splitter BS4s; a light receiving element PD6s for receiving output light Rm from absorption cell CL2s and converting it into an electrical signal; comparator CP1s to which the output of light receiving element PD6s is connected;and a marker signal output terminal 303s connected to the output of comparator CP1s. The standard substance may be Cs (two absorption beams in the vicinity of 852 nm) , Rb (four absorption beams in the vicinity of 780 nm, and four absorption beams in the vicinity of 794 nm), $NH_3$ (a plurality of absorption beams) $H_2O$ ( a plurality of absorption beams).

The operation of the FIG. 22 embodiment is as follows. The synthesizer/sweeper 302s is capable of varying the wavelength of the output light so as to correspond to the sign Ei which is applied via input terminal 301s. Part of the beams of light are reflected on beam splitter BS4s thereby to become able wavelength output light Rv. The rest of the beams are through beam splitter BS4s and strike absorption cell CL2s. The incident light is subjected to absorption at a specified wavelength with the aid of the standard substance within the cell CL2s. Subsequently, the transmitted light Rm which has a peak value (i.e. the lowest point) at the above wavelength, is outputted. Light receiving element PD6s converts the output light Rm into an electric signal. The thus converted signal is waveform arranged in comparator CP1s. It is then outputted as a marker signal Em from terminal 303s.

Figure 23:
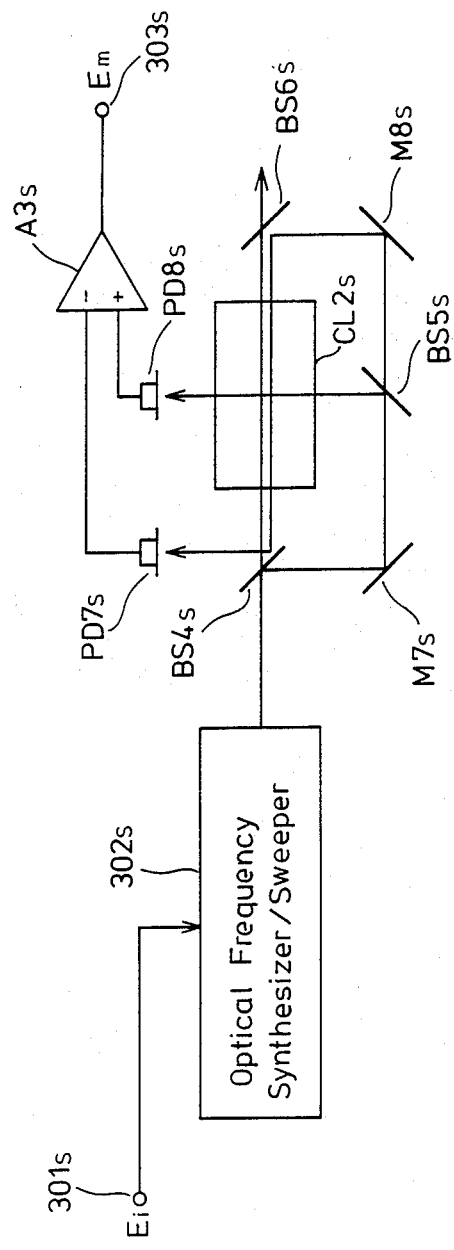
FIG. 23 is a block diagram depicting a marker attached variation of the arrangement of FIG. 22, wherein saturated absorption is used.

FIG. 23 depicts a variation of the marker attached variable wavelength light source of FIG. 22 and utilizes the saturated absorption effect. The same components as those of the device of FIG. 22 are marked with the same symbols and are not described further hereat. The arrangement comprises a mirror M7s for diverting the direction of the output light , partially reflected on the beam splitter BS4s, from optical synthesizer/sweeper 302s; beam splitter BS5s upon which light reflected by mirror M7s strikes; light receiving element PD8s for receiving light reflected by beam splitter BS5s and as a reference light made to fall in the perpendicular direction on absorption cell CL2s; mirror M8s upon which light transmitted through beam splitter BS5s strikes, a beam splitter BS6s for receiving light reflected by mirror M8s (not for clarity the reflected beam is shown not touching the beam splitter BS6s) and for causing the reflected light, serving as probe light, to strike from the reverse direction upon absorption cell CL2s; a light receiving element PD7s which receives light reflected by beam splitter BS4s after the probe light has passed through absorption cell CL2s; and an arithmetic unit A3s for computing the difference between the outputs from light receiving elements P*7s and PD8s.

The output light from synthesizer/sweeper 302s is transmitted by beam splitter BS4s and falls, as saturation light, upon absorption cell CL2s in order to saturate the absorption of the standard substance on the light path. The light reflected by beam splitter BS4s strikes, as probe light, from a direction opposite to that of the saturation light (via mirror M7s, beam splitter BS5s, Mirror M8s and beam splitter BS6s) upon absorption cell CL2s. Since the probe light is sufficiently narrower than the saturation light, it is feasible to superpose the optical axes of the saturation light and of the probe light on each other within absorption cell CL2s.

The probe light is subjected to absorption having the Doppler expansion at frequencies exclusive of the resonant frequency of the standard substance. The reference light which reflects on beam splitter BS5s and strikes in combination with the saturation light and the probe light from the perpendicular direction upon absorption cell CL2s undergoes absorption having Doppler expansion. The probe light and reference light which have been subjected to absorption are respectively detected by light receiving elements PD7s, PD8s and are subtracted by arithmetic unit A3s, whereby there are outputted sharp absorption signals serving as the marker signals Em which consist of saturated absorption signals alone characterized such that portions in which Doppler expansion inherent in the absorption signals of the probe light is present, are eliminated. Since the absorption beams having the infinitesimal structure, which are hidden due to the Doppler shift, are detected, it is possible to procure still higher accuracy and stability than those of the linear absorption method used in FIG. 22.

Figure 24:
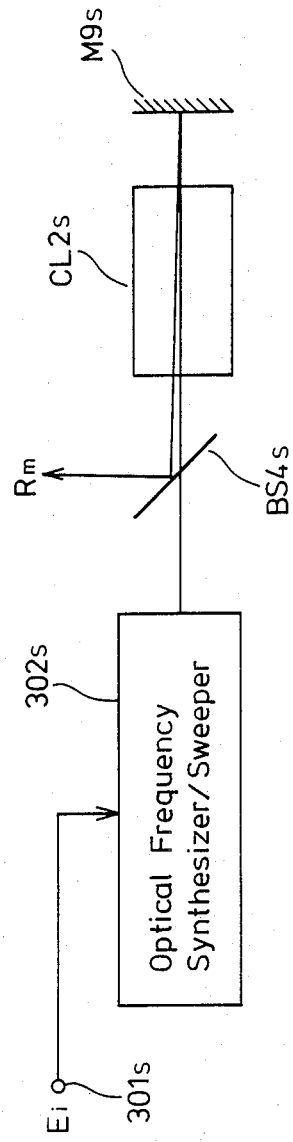
FIG. 24 is a block diagram depicting principal portions of a second variation of the marker attached arrangement which uses absorption saturation.

FIG. 24 depicts another marker attached light source which utilizes saturated absorption . The saturation light which is transmitted through absorption cell CL2 is reflected by mirror M9s. The reflected light, serving as a probe light, moves from the opposite direction through absorption cell CL2s once again so as to be overlapped with the saturation light, and then is reflected by beam splitter BS4s and outputted as marker light output Rm.

As in the case of FIG. 16, the marker attached light source shown in FIGS. 22,23,24 can be usedin the arrangement of FIGS. 19, 20, 21. In that case, since the marker light, whose wavelength, as well as measurement data so manifested, is displayed or recorded, it is feasible to determine both the wavelength properties and the spectral properties in a highly precise manner.

It is to be noted that , as another example, there may be used various kinds of semiconductor laser. wavelength stabilizers which will be further explained hereibelow.

Figure 25:
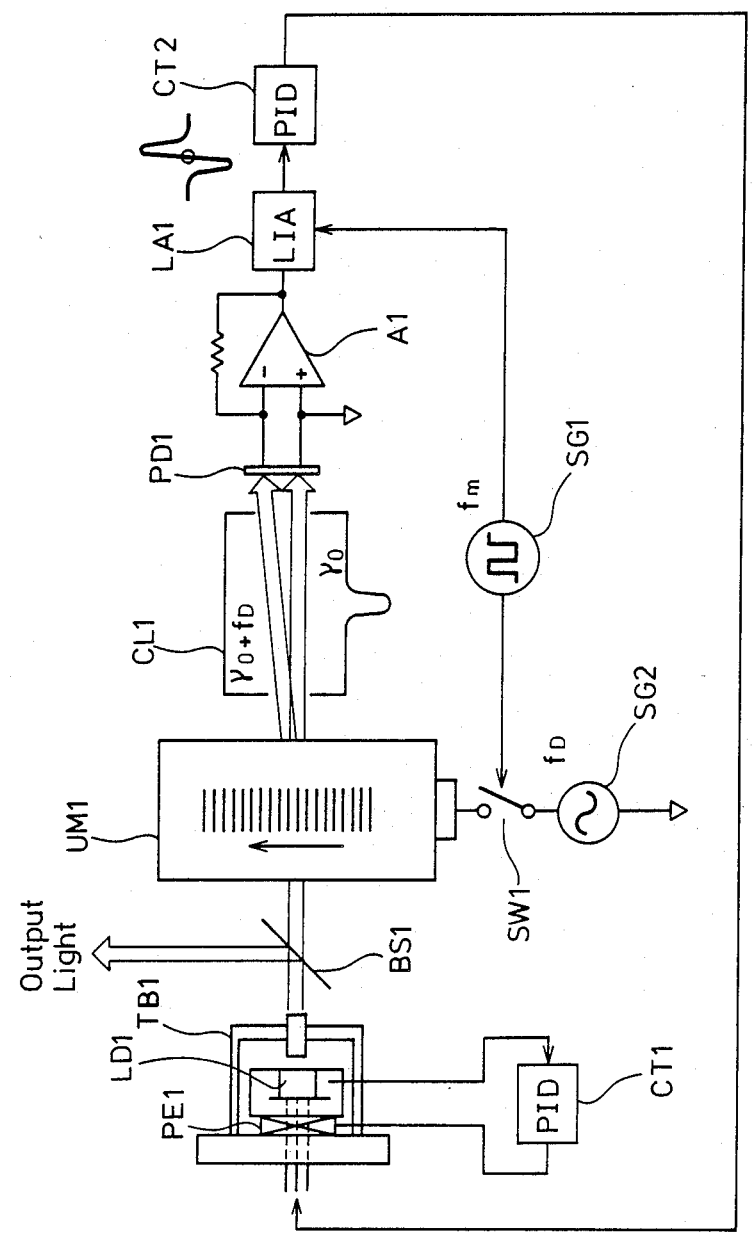
FIG. 25 is a block diagram depicting an example of a frequency stabilized laser as another example of a reference wavelength light source.

FIG. 25 depicts another illustrative stabilizer comprising a semiconductor laser LD1, Peltier element PE1 for cooling off or heating laser LD1; temperature control means CT1 for controlling the temperature of laser LD1 to a fixed value by driving Peltier element PE1; constant temperature oven TB1 for decreasing fluctuations in temperatures by housing the laser LD1 and Peltier element PE1; beam splitter BS1 for bidirectionally splitting output light emitted from laser LD1; acousto-optic deflector (called "AOD") UM1 upon which one flux of light emerging from beam splitter BS1 strikes (this acousto optic deflector constitutes a modulator means); absorption cell CL1 which receives diffraction light output from deflector UML (this absorption cell CL1 comprises a standard substance, e.g. Cs, which absorbs the light at a specified wavelength); an optical detector PD1 which receives light transmitted through cell CL1; amplifier A1 for receiving output electrical signals from photo detector PD1; lock in amplifier LA1 for inputting electric outputs from amplifier A1; a PID controller CT2 which comprises an electric current control circuit both for inputting the outputs from lock in amplifier LA1 and for controlling electric current from laser LD1; a switch SW1 having one end thereof connected to deflector UM1; signal generator SG1 for applying output signals to turn on switch SW1 ON and OFF at the frequency fm (e.g. 2 KHz); and a second signal generator SG2 to which the other end of switch SW1 is connected (the second signal generator SG2 has a frequency $f_D$, e.g. 80 MHz).

The operation of the FIG. 25 embodiment is as follows. The temperature of laser LD1 is controlled to a fixed value through use of element PE1 by means of control circuit CT1 for inputting temperature detecting signals within oven TB1. Output from laser LD1 is bidirectionally split by beam splitter BS1. The reflected light serves as output light for the arrangement. the transmitted light is supplied to acoustooptic deflector UM1. Since deflector UM1 is driven by signals with frequency $f_D$ which are supplied by signal generator SG2 when switch SW1 is ON, the majority of incident light with frequency $\omega_o$ is diffracted and is then subjected to frequency (i.e. Doppler) shift. Light with frequency $\omega_o + f_D$, which is defined as a primary diffraction light is supplied to absorption cell CL1. When switch SW1 is OFF, the incident light having frequency $\omega_o$ which is all defined as zero-dimensional diffraction light, is supplied to the absorption cell CL1. Switch SW1 is driven by a clock with frequency fm which is included in generator SG1. Thus, light falling upon cell CL1 undergoes frequency modulation in which the modulation frequency is fm, and the modulation depth is $f_D$.

Figure 26:
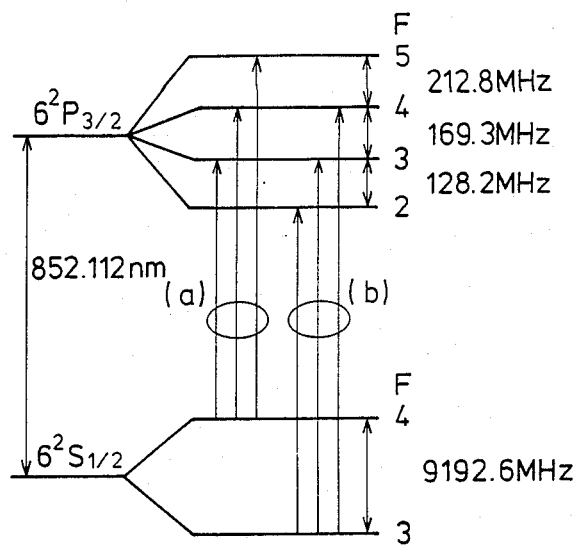
FIG. 26 is an energy chart depicting an infinitesimal structure of an energy level of a Cs atom.

FIG. 26 depicts energy levels of the Cs atom. In the chart of FIG. 26, if light with a wavelength of 852.111 nm impinges on the Cs atoms, carriers are excited from $6^2S_{\frac{1}{2}}$ to $6^2P_{3/2}$ and the light loses its energy, whereby absorption takes place. In this case, the levels of $6^2S_{\frac{1}{2}}$, $6^2P_{3/2}$ are possessed of two or four pieces of infinitesimal structures, respectively. Strictly speaking, absorption thus occurs with respect to light having six types of wavelengths (or frequencies) between these levels. In fact, however, since an absorption spectrum width bears several hundres MHz because of the Doppler expansion, no infinitesimal structure having the level of $6^2P_{3/2}$ can usually be observed.

Figure 27:
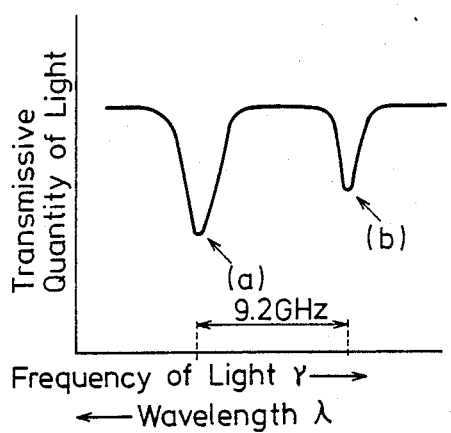
FIG. 27 is a graph depicting optical absorption caused by the Cs atoms.

Consequently, as shown in FIG. 27, it is observed that two kinds of absorptions (a) and (b) are present on the absorption spectrum line. Point (a) of the absorption signals shown in FIG. 27 involves one sent from F4 as shown by bundle (a) in FIG. 26. Point (b) depicted in FIG. 27 is sent from F3 as shown by bundle (b) in FIG. 26.

Figure 28:
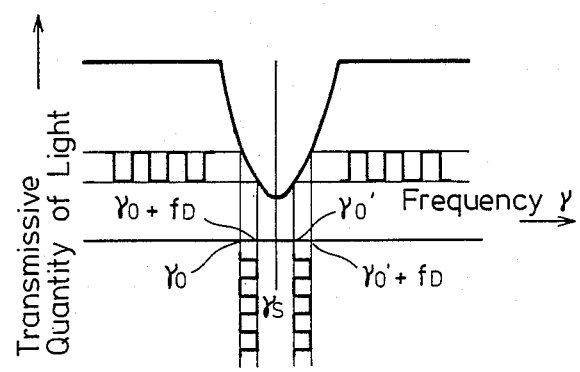
FIG. 28 is an explanatory view depicting operation of the embodiment of FIG. 25.
Figure 29:
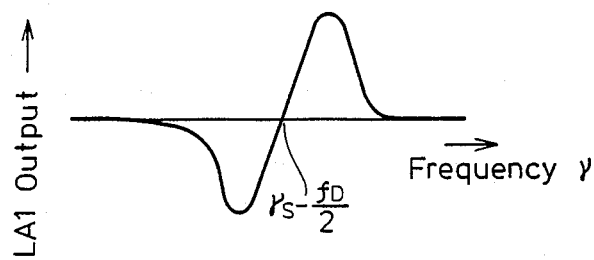
FIG. 29 is a diagram depicting a second characteristic curve of operation of the arrangement of FIG 25.

When light modulated by deflector UM1 falls upon cell CL1, as depicted in FIG. 28, the signal appears in the output by the transmitted light volume being modulated at the position alon (e.g. (a) of FIG. 27) of the absorption signals. Provided that the signal is converted into electrical signal by means of detector PD1 and the converted electrical signal is then synchronously rectified as the frequency fm in lock in amplifier LA1 with the aid of amplifier A1, there is obtained a primary differential waveform, such as shown in FIG. 29. If the outputs of lock in amplifier LA1 are locked (i.e. controlled) to the center of primary differential waveform, the output light of laser LD1 will have a stable frequency of $\omega_s - f_D/2$.

According to the FIG. 5 embodiment, since oscillation frequency of laser LD1 is not modulated, the light source has high stability for instantaneousness of frequency.

Even if diffraction efficiency of deflector UM1 is varied, an optical component (zero-dimensional diffraction light) which does not contribute to modulation increases in volume, whereas signal intensity merely decreases; and no influence is exerted on the central wavelength.

Although modulation frequency fm is used as the reference frequency of lock in amplifier LA1 in FIG. 25, odd numbered multiples of frequencies may also be used.

The standard substance in cell CL1 may be, for example, Rb, $NH_3$, $H_2O$, instead of Cs. Also, the deflector UM1 is utilized as the modulation means. However, the invention is not limited to such device. For example, a phase modulator which makes use of an electrooptical element may be used. This involves, for example, a longitudinal type modulator, a lateral type modulator and a travellingwave type modulator.

In the FIG. 25 embodiment, the electric current supplied to semiconductor laser LD1 is controlled by the output signals from a control means. Stability of wavelength may also be effected by controlling the temperature of the laser LD1.

Figure 30:
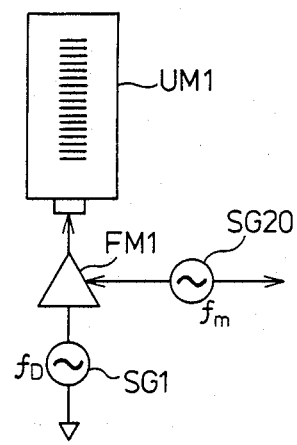
FIG. 30 is a block diagram depicting principal portions of a second example of frequency stabilized semiconductor laser.

FIG. 30 depicts principal portions of another semiconductor laser wavelength stabilizer, wherein an FM modulator FM1 is controlled by a sine wave generator SG20 (e.g. modulation frequency fm = 2 kHz), whereby the acousto-optic deflector UM1 is modulated by sine waves.

Figure 31:
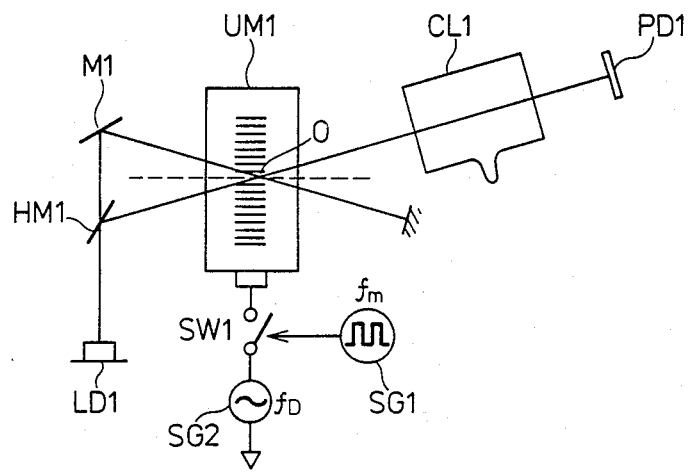
FIG. 31 is a block diagram depicting principal portions of an optical system of a third example of a frequency stabilized semiconductor laser.

FIG. 31 depicts principal portions of the optical system of another semiconductor laser wavelength stabilizer comprising half mirror HM1 for bidirectionally splitting the output light from semiconductor laser LD1 and for causing the reflected light to strike from one direction acousto-optic defector UM1; mirror M1 on which light passing through half mirror HM1 is reflected (mirror M1 causes the reflected light to travel from the other direction through deflector UM1). When switch SW1 is in the OFF state, light which is reflected by half mirror HM1 is transmitted through deflector UM1 and then strikes absorption cell CL1 at frequency $\omega_o$. When switch SW1 is ON, light which is reflected by mirror M1 is diffracted by deflector UM1 and then falls upon absorption cell CL1 at frequency $\omega_o + f_D$.

The FIG. 31 embodiment yields an advantage such that the light path is unmovable within the absorption cell. However, where there is used a phase modulator which utilizes an electro-optical element as the modulating means, the necessity does not arise, because the direction of output light is substantially unchanged.

Figure 32:
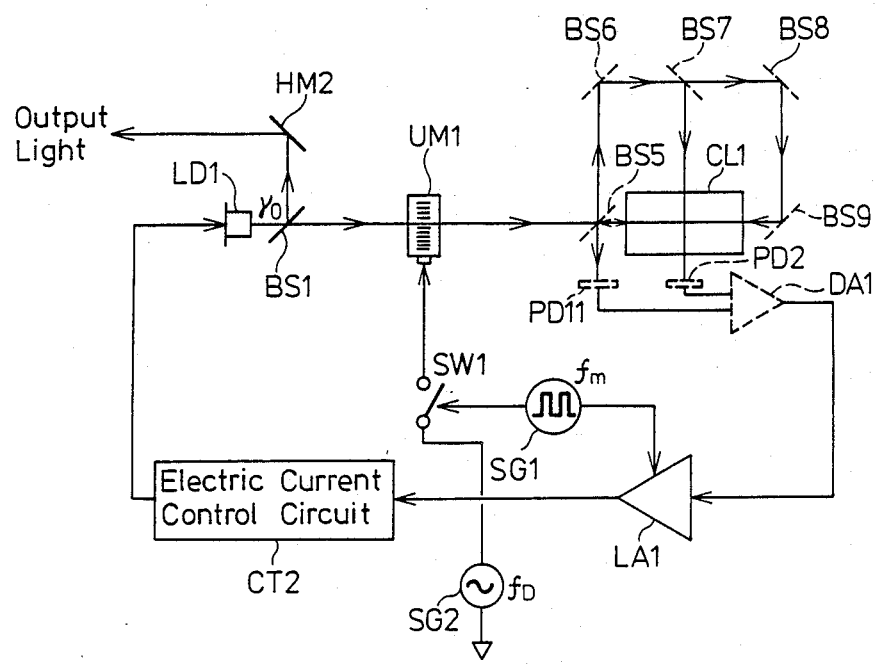
FIG. 32 is a block diagram depicting a fourth example of a frequency stabilized semiconductor laser.

FIG. 32 depicts a further example of a stabilizer wherein one part of the fluxes of emergent light from deflector UM1 is, as pump light, made to fall upon cell CL1, and the other part of narrow fluxes of emergent light is, as probe light, made to strike from the opposite direction cell CL1, thereby obtaining saturated absorption signals. By virtue of this saturated absorption spectroscopy, the Doppler expansion disappears. Hence, it is feasible to distinguish the infinitesimal structure which was prevosously explained with reference to FIG. 26. Since the output signals of lockin amplifier LA1, which are based on the infinitesimal structure shown in FIG. 33, can be obtained, it is possible to realize a still more stable semiconductor laser 1wavelength stabilizing by locking to any one (e.g. $\omega_1$ of FIG. 33) of the output signals. The portion indicated by the dotted line in FIG. 32 is different from the embodiment of FIG. 25. Namely, as shown in FIG. 32, there are provided beam splitters BS5 to BS9, light receiving elements PD11, PD2 and a differential amplifier DA1; and the outputs of this differential amplifier DA1 are introduced into lock in amplifier LA1. In such a case, it is in fact favorable to adopt the arrangement of FIG. 31 in order that the direction of output light from deflector UM1 does not vary at all.

Figures 33, 34:
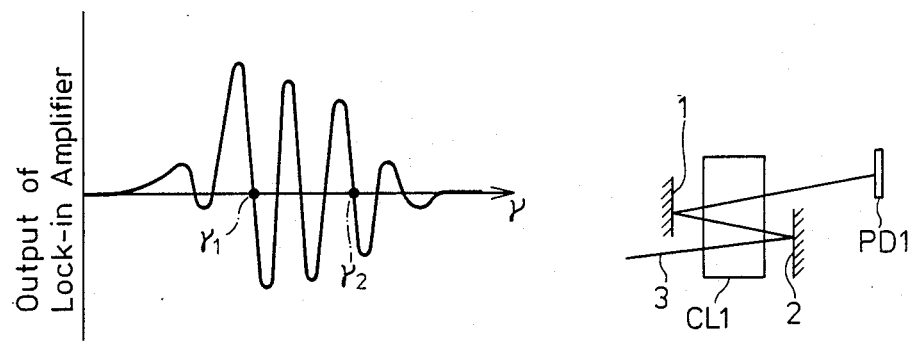
FIG. 33 is a graph depicting an output signal of a lock in amplifier of the arrangement of FIG. 32.
FIG. 34 is a block diagram depicting principal portions of a fifth example of the frequency stabilized semiconductor laser.

FIG. 34 depicts principals portions of another stabilizer wherein the reflective pattern through absorption cell CL1 of FIG. 25 is changed. Only the circumferential portion of cell CL1 is shown. The arrangement comprises reflection members 1,2 and a light path 3 for the output light from deflector UM1 which light comprises the zerodimensional diffraction light and the primary diffraction light. The output light 3 from deflector UM1 passes through cell CL1 and is then reflected by reflection member 2. The reflected light passes through cell CL1 once again and is similarly reflected by reflection member 1. After again passing through absorption cell CL1, the light falls on photo detector PD1. Since light 3 passed through cell CL1 three times, even if the length of the cell CL1 is reduced by a factor of 3, the volume of absorption is the same.

Figure 35:
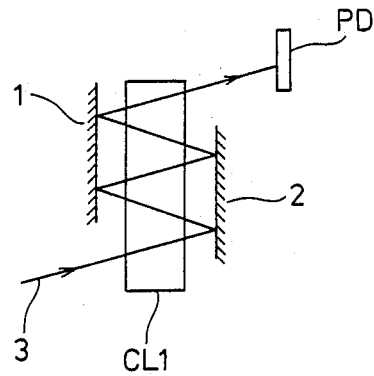
FIG. 35 is a block diagram depicting principal portions of a sixth example of the frequency stabilized semiconductor laser.

FIG. 35 depicts an arrangement similar to that of FIG. 34 wherein light 3 passes through absorption cell CL1 five times. The width of cell CL1 and reflection members 1,2 are broadened to cause the light to be reflected a plurality of times. The output light emitted from deflector UM1 is reflected on reflector 1,2, respectively, and ultimately falls on detector PD1. The output light passes through cell CL1 five times. Thus, it is feasible to proportionally reduce the length of the cell CL1. It is possible to set the number of passes through cell CL1, as desired, by adjusting the widths of both the cell CL1 and reflection members 1,2 and also the angles at which the output light strikes cell CL1.

Figure 36:
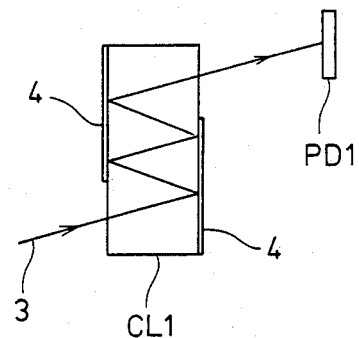
FIG. 36 is a block diagram depicting principal portions of a seventh example of the frequency stabilized semiconductor laser.

FIG. 36 is a device similar to FIG. 35 wherein reflective patterns enable 5 passes of light through cell CL1, but in this case, reflection members 1,2 are not individually provided. Instead, a metallic thin film 4 formed on cell CL1 by vapor deposition or other similar methods is used as the reflection members. With this arrangement, it is possible to further reduce the size of the cell CL1.

In the embodiments of FIGS. 34,35,36, where the size of the absorption cell is the same as the conventional one, the length of the light path can be made longer than the conventional one. Thus, advantageously, the amount of absorption increases and the stability of wavelength of output light is improved with the same size of cell.

Figure 37:
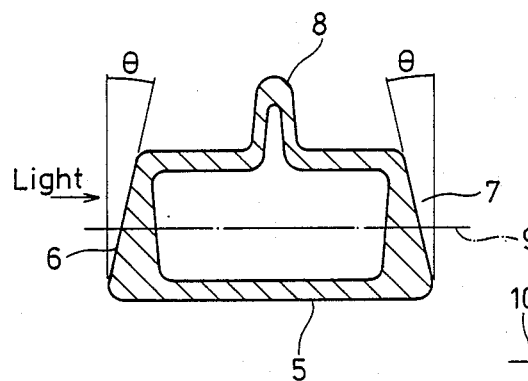
FIG. 37 is a sectional view depicting the principle portions of an eighth example of the frequency stabilized semiconductor laser.

FIG. 37 depicts principal portions of the absorption cell CL1 of FIG. 25, which shows a section cut by a plane including the central axis of the absorption cell CL1. The cell CL1 comprises a vessel 5, an incidence plane of light 6, an emergence plane of light 7, a sealing port 8 and a central axis 9 of the cell CL1. Both incidence plane and emergence plane 7 are inclined at an angle $\theta$ to the plane perpendicular to the central axis 9.

Figure 38:
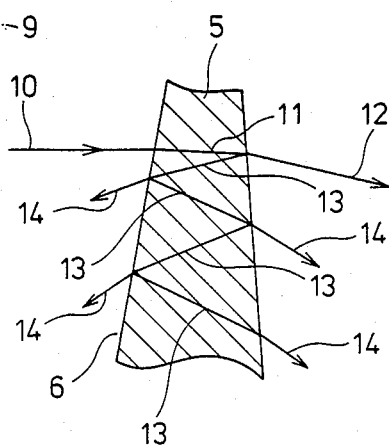
FIG. 38 is an explanatory view depicting operation of the embodiment of FIG. 37.

FIG. 38 depicts a pattern of multiple reflections of light on incident plane 6, comprising a flux 10 of incident light; another flux 11 of incident light within vessel 5, a flux 12 of transmitted light, a flux 13 of multiply reflected light within vessel 5 and another flux 14 of multiply reflected light which exits vessel 5. Since incidence plane 6 is not parallel to the plane perpendicular to the central axis 9 of vessel 5, the multiply reflected light fluxes 13,14 of incident light flux 10 which falls in parallel to the central axis are reflected in directions different from flux 10. For this reason, incident flux 11 and multiply reflected flux 13 do not interfere with each other at all, and incident flux 10, transmitted flux 12 and multiply reflected exit flux 14 do not interfere with each other. Thus, noise cause for interference of these fluxes, is not present and intensity of transmitted light does not fluctuate with frequency, thereby producing enhanced stability. The light reflection and transmission patterns described in connection with the incident plane 6 is the same with emergence plane 7.

The oblique angle $\theta$ varies in accordance with the thickness of vessel 5, beam diameter of incident light or the like, but 2° to 3° are sufficient in the ordinary case. Vessel 5 is described to be in the form of a circular cylinder; however, it may assume other suitable configurations with like angularity. In short. the incidence plane and emergence plane are flat and the two need only be disposed vis-a-vis with respect to each other. The incidence plane 6 and emergence plane 7 of vessel 5 may comprise light transmissive material, and other portions may be of non-transparent material. Furthermore, the slopes of incidence and emergence planes 6,7 need not be given to both the inside and outside of vessel 5. It is sufficient that only one be inclined.

Figure 39:
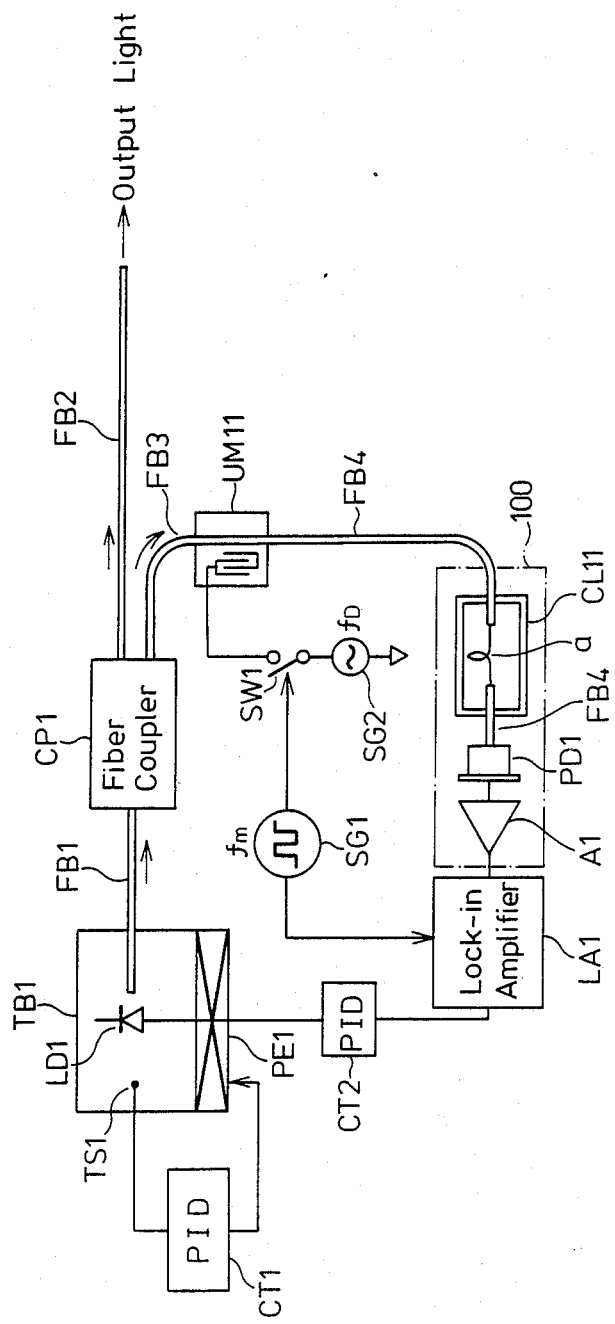
FIG. 39 is a block diagram depicting a ninth example of the frequency stabilized semiconductor laser, wherein the absorption of evanescent wave of light is used.

FIG. 39 depicts a stabilizer wherein evanescent absorption of light is utilized, and which comprises a single mode optical fiber FB1 which receives and transmits output light from semiconductor laser LD1; a fibercouple CP1 for receiving the output light from fiber FB1; another single mode optical fiber FB2 through which is transmitted one flux of output light from coubpler CP1; another single mode optical fiber FB3 through which is transmitted another flux of output light from coupler CP1; a waveguide passage type acousto-optic deflector UM11 for inputting the output light transmitted through fiber FB3; a further single mode optical fiber FB4 for transmitting output light from deflector UM11 and also causing the emission of light to photo detector PD1; and an absorption cell CL11 through which fiber FB4 passes (cell CL11 comprises a standard substance,e.g. Cs, which absorbs light at a given wavelength). A core portion a left after removing a cladding portion of fiber FB4 is contained within cell CL11.

Figure 40:
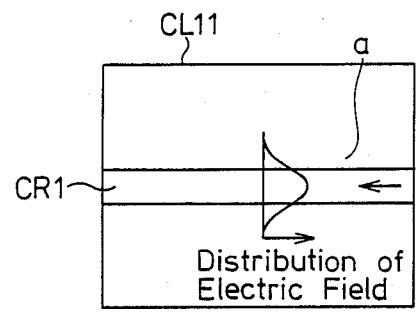
FIG. 40 is a view depicting operation of the embodiment of FIG. 39.

Operation of the FIB. 39 embodiment is as follows. The output light from laser LD1, which is controlled in terms of temperature, travels via fiber FB1 and is then branched off into two directions by coupler CP1. One flux of branched output light is emitted outside as output light from the stabilizer through the intermediary of fiber FB2. The other flux is made to strike via fiber FB3 upon deflector UM11. The light is modulated by deflector UM11 and travels through fiber FB4 and then penetrates cell CL11. Within cell CL1, as shown in FIG. 40, there is generated an evanescent wave, viz., a portion of which the propagation light permeates outside of the core portion of fiber FB4. An electric field over this portion mutually acts on the circumferential Cs gas, whereby absorption takes place at a specified wavelength. Thus, when the output of fiber FB4 is detected by detector PD1, absorption signals are obtained. As in the conventional case, when feeding light via lock in amplifier LA1, and the like, back to laser LD1, the oscillating frequency of the laser LD1 is controlled, or locked, to an area close to the center of absorption.

The stabilizer of FIG. 39 has advantages which are similar to those of FIG.25. In addition, the optical system consists entirely of fibers and hence positioning operation is not required, thus leading to simplicity of adjustment and possibility of miniaturization thereof.

A single mode fiber is used as the fiber FB4 passing through cell CL11. However, the invention is not so limited and a multiple mode fiber can also be used.

Figure 41:
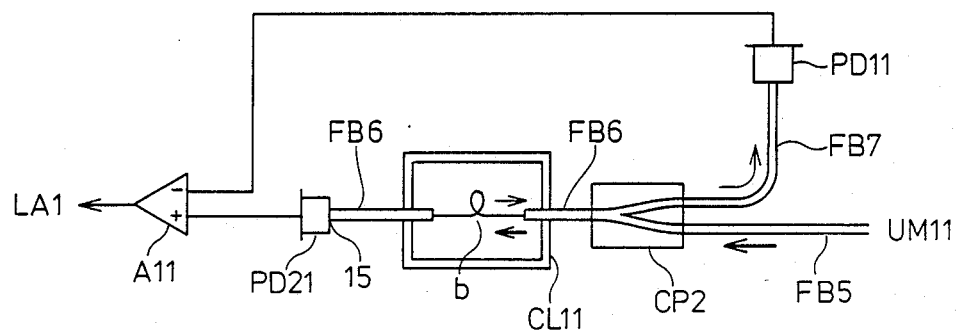
FIG. 41 is a block diagram depicting principal portions of a tenth example of frequency stabilized semiconductor laser, wherein the arrangement of FIG. 39 is partially modified.

FIG. 41 depicts another arrangement of components 100 shown in FIG. 39, which uses a saturated absorption method. The arrangement comprises a single mode optical fiber FB5 for propagating output light from acousto-optic deflector UM11; a fiber coupler CP2, one end of which is connected to fiber FB5; and another single mode optical fiber FB6 which is connected to another end of coupler CP2. A core portion b remaining after a cladding portion of fiber FB6 is removed, is located within absorption cell CL11. A half mirror coated end surface 15 is provided on fiber FB6. A first photo detector PD21 f detects light transmitted through end surface 15. A second photo detector PD11 detects light which is reflected by end surface 15 and passed again through cell CL11, and then through fiber coupler CP2, and fiber FB7. A differential amplifier A11 inputs electric outputs from detectors PD21, PD11 and outputs the difference signal to lock in amplifier LA1.

In the arrangement of FIG. 41, output from deflector UM11 is transmitted through fiber FB5 and coupler CP2 and fiber FB6. Subsequently, evanescent waves produced outside core portion b, which waves, as pump light, saturate the light absorption of standard substance e.g. Cs, in the vicinity thereof. The major part (e.g. 90%) of light travelling through fiber FB6 strikes detector PD21, via end surface 15. On the other hand, the remainder (e.g. 10%) of light is reflected by end surface 15 and travels through fiber FB6 in the reversed direction. It evanescent waves, as probe light, overlaps the pump light to produce the absorption. This probe light is led, via fiber FB6, coupler CP2 and fiber FB7, to detector PD11. Since the output of detectors PD21, PD11 are subtracted from each other in differential amplifier A11, the absorption signals by Doppler expansion are erased, thereby supplying saturated absorption signals having sharp absorption spectrums to lock in amplifier LA1. Because of the feedback loop, such as shown in FIG. 39, it is feasible to control the oscillating frequency of laser LD1 in a highly stable manner by virtue of peaks of saturated absorption spectrums.

In the FIG. 41 embodiment, the end surface 15 is coated with a material to form a half mirror, but is not limited to such arrangement. For example, the half mirror may be interposed between, for example, the fibers FB6.

Figure 42:
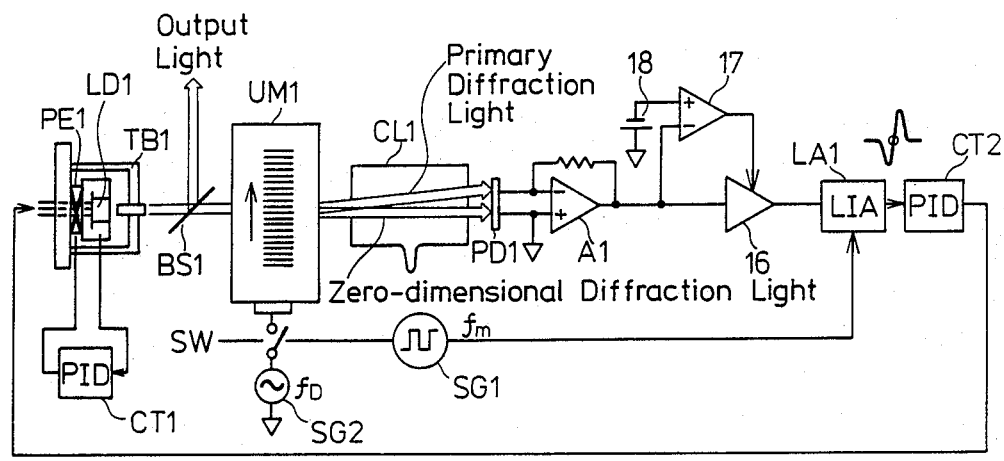
FIG. 42 is a block diagram depicting an eleventh example of the frequency stabilized semiconductor laser.

FIG. 42 depicts another stabilizer which differs from the FIG. 25 embodiment in the following manner. A variable gain amplifier 16 receives the outputs from amplifier A1 and supplies outputs to lock in amplifier LA1. A comparator 17 comprises an inversion (−) input terminal which is connected to the output terminal of amplifier A1. A setting power souce 18 is connected to the non-inverstion (+) input terminal and ground or common potential point. The gain of amplifier 16 is controlled by comparator 17.

Figure 43:
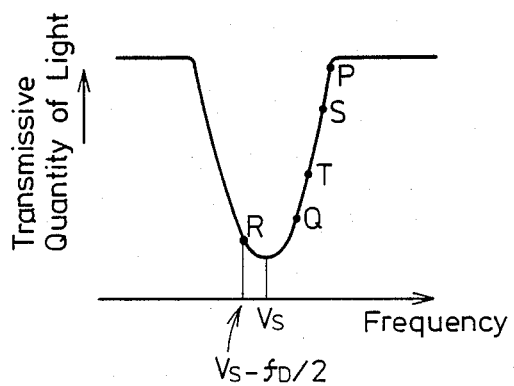
FIG. 43 is a view depicting operation of the embodiment of FIG. 42.

In the FIG. 42 embodiment, resonant absorption of absorption cell CL1 is as shown in FIG. 43. Supposing that the frequency of output light from deflector UM1 is positioned at point P, then as the amount of transmitted light increases, the output of amplifier A1 is largely deflected in the negative direction, the output of comparator 17 assumes a high level, and the gain of variable gain amplifier 16 diminishes. Subsequently, a moving point slowly shifts from point P towards the bottom of the resonant absorption curve, i.e. in the direction of frequency $\omega_s$. Concurrently, the transmitted light decreases in volume, whereas the output of amplifier A1 gradually grows. At a point Q, the output of amplifier A1 becomes higher than setting power source 18, the output of comparator 17 goes to a low level, and the gain of amplifier 16 is heightened, whereby the output of laser LD1 is maintained at a point R with high stability.

Figure 44:
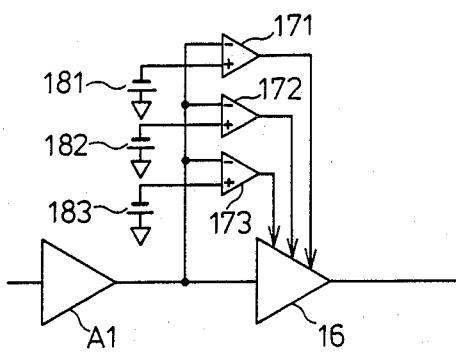
FIG. 44 is a block diagram depicting principal portions of a twelfth example of the frequency stabilized semiconductor laser.

FIG. 44 depicts a plurality of comparators 171,172,173 which may be used in the arrangement of FIG. 42, and a mechanism for changing the gain of amplifier 16. The output of amplifier A1 is connected to each of the inversion (−) input terminals of comparators 171,172,173. The outputs of comparator 171,172,173 control the outputs of amplifier 16. Setting power sources 181,182,183 are connected to the noninverting (+) input terminals of comparators 171,172,173, respectively, and to ground. Although not shown, as in FIG. 42, the outputs of detector PD1 are inputted to amplifier A1, and the outputs from amplifier 16 are applied to amplifier LA1. In the embodiment, comparators 171,172,173 individually assume low level as at points S,T, Q of FIG. 43, and the gain of amplifier 16 gradually rises. With this approach, it is possible to stably converge at point R at a high velocity. The gain of amplifier 16 may thus be consecutively controlled.

Figure 45:
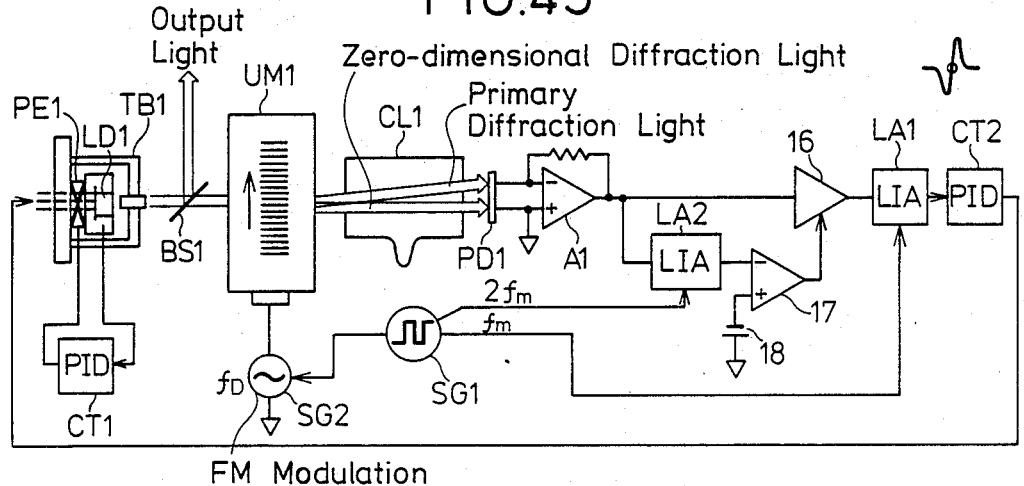
FIG. 45 is a block diagram depicting a thirteenth example of the frequency stabilized semiconductor laser.

FIG. 45 depicts a stabilizer wherein the secondary differential waveform of amplifier A1 is used as an input to the comparator in the arrangement of FIG. 42. The difference between FIGS. 45 and 42 is as follows. Signal generator SG1 frequency modulates SG2 with sine waves or chopping waves. The output signals from amplifier A1 are inputted to lock in amplifier LA2 and variable gain amplifier 16. Lock in amplifier LA2 is driven by signals from generator SG1 which generates signals of frequency 2fm which is twice as high as the modulation frequency of signal generator SG2. The lock in amplifier LA2 synchronously rectifies the applied signals. The secondary differential of amplifier is thus obtained. Output signals from lock in amplifier LA2 are inputted to the inversion (−) input terminal of comparator 17 which supplies output signals to control the amplifier 16. Output signals from amplifier 16 are inputted to lock in amplifier LA1. A setting power source 18 is connected to the noninversion (+) input terminal of comparator 17.

According to the embodiments of FIGS. 42,44, 45, in case the wavelength of the output light from laser LD1 deviates from the preset value, there is very little likelihood of the wavelength exceeding the preset value. Even if there is some deviation, it is possible with the invention to still converse the wavelength to the preset value. Thus, a highly stable control of wavelength is obtained.

In the embodiments of FIGS. 42,44,45, amplifier 16 is disposed behind amplifier A1. It is possible, however, to locate the amplifier 16 at the rear of amplifier LA1 and PID controller CT2. Any place within the feedback loop may be used.

Figure 46:
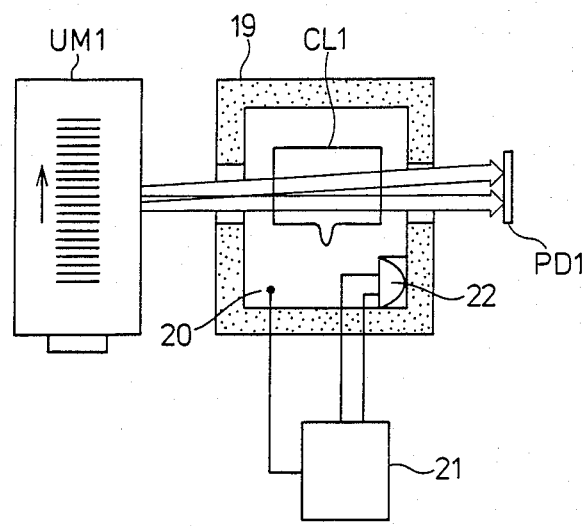
FIG. 46 is a block diagram depicting principal portions of a fourteenth example of the frequency stabilized semiconductor laser.

FIG. 46 depicts principal portions of a stabilizer where the temperature of the absorption cell CL1 is controlled to a fixed temperature, such as in the arrangement of FIG. 25. The arrangement of FIG. 46 comprises a constant temperature oven 19 surrounded by an adiabatic material, the inside of which is provided absorption cell CL1 and which is formed a path for output light from acousto-optic deflector UM1; a temperature measuring element 20 disposed inside oven 19; a heater 22 disposed within the oven 19; and a temperature adjuster 21. The output of element 20 is inputted to adjuster 21 which sends signals to control heater 22. A temperature control means may be considered to comprise oven 19, measuring element 20, adjuster 21 and heater 22. The temperature within oven 19 is measured by element 20. Heater 22 is controlled by adjuster so as to keep the temperature in oven 19 substantially constant. The temperature of oven 19 is set to a value such that the volume of absorption is large in accordance with dimensions of the absorption cell, and its secondary differential comes to a maximum. When the standard substance is Cs, the volume of absorption is small at a temperature of less than 20° C., and there exists the most suitable value of the secondary differential of the absorption quantity in the vicinity of 40° C.

According to the arrangement, even if the circumferential temperature varies, the temperature of the absorption cell CL1 is kept constant. Consequently, there is no variation in volume of absorption and in amount of the secondary differential, and the stability of the wavelength of the output light is not deteriorated at all by fluctuations in circumferential temperature. Furthermore, temperatures at which the absorption quantity of the absorption cell is increased, can be selected regardless of the circumferential temperature. Thus, it is feasible to obtain comparatively large amounts of absorption with respect to even a small absorption cell. Accordingly, the embodiment can be readily miniaturized. In addition, it is usable within a wide range of circumferential temperatures.

In the FIG. 46 embodiment, the heater alone is used for controlling the temperature. However, if the temperature to be controlled approximates the circumferential temperature, a cooling means may be additionally used. Moreover, there may be used in place of heater 22, a device such as a Peltier element which is capable of heating and cooling.

Temperature measuring element 20 and adjuster 21 may be omitted by making use of a PTC thermistor or a posistor whose resistance value increases in proportion to the temperature increases, in place of heater 22.

Figure 47:
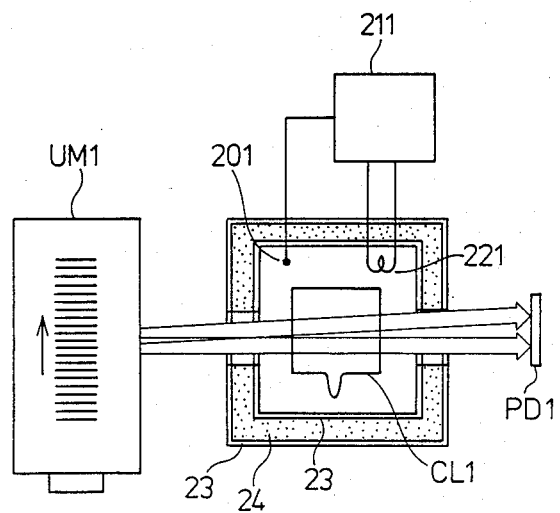
FIG. 47 is a block diagram depicting principal portions of a fifteenth example of the frequency stabilized semiconductor laser.

FIG. 47 depicts principal portions of a stabilizer wherein the absorption cell is not subjected to either circumferential temperature differences or outside magnetic field influences. The arrangement may be used in the embodiment of FIG. 25, and comprises soft magnetic plates 23 such as a permalloy or the like material; an adiabatic material 24 surrounding absorption cell CL1 except for a path for the output light from acousto-optic deflector UM1; a temperature measuring element 201 for measuring temperature around cell CL1; and a temperature adjuster 211. The output of element 201 is inputted to adjuster 211. Heater 221, located inside the oven, is driven by adjuster 24. The temperature of air space encompassed by the soft magnetic plates 23 and adiabatic material 24 is controlled by means of element 201, adjuster 211 and heater 221, so as to be substantially constant.

According to the FIG. 47 embodiment, in addition to keeping the temperature of cell CL1 substantially constant, the magnetic shielding effectively shields the cell from outside magnetic influences. Magnetic forces cause the absorption spectrum to bring forth Zeeman splitting which causes the frequency and wavelength of the output light to be distored and varied. Thus, advantageously, with the magnetic shielding of FIG. 47, such deficiencies are eliminated. Also, since the entire stabilizer need not be encased in a magnetic shield, with such embodiment of FIG. 46, the stabilizer itself can be held to a minimum size and only the oven need by enclosed by a magnetic shield, or if no constant temperature surrounding is desired, only magnetic shield of the cell need be used.

In the embodiment of FIG. 47, two sheets of soft magnetic plates 23 and a sheet of adiabatic material 24 are used. However, only one sheet of soft magnetic plate 23 can be used or a plurality of such plates may be used superposed on each other. In the latter case, if the thin soft magnetic plate 23 and adiabatic layers are laminated, alternately, the magnetic shielding effect is enhance. Also, where the circumferential temperature does not vary much, heater 221 can be omitted.

Figure 48:
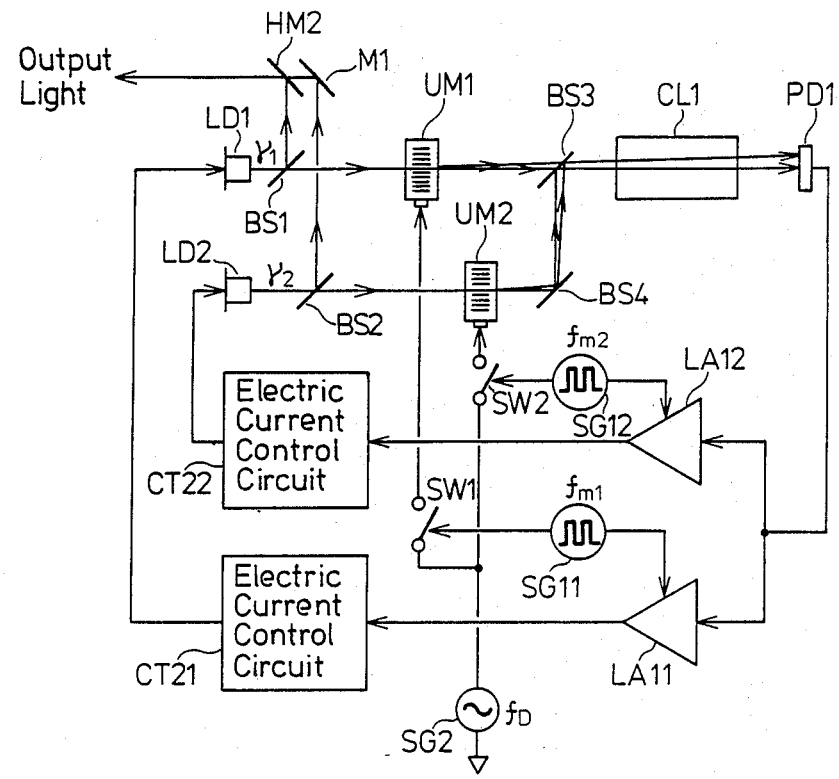
FIG. 48 is a block diagram depicting a sixteenth example of the frequency stabilized semiconductor laser.

FIG. 48 depicts another semiconductor laser wavelength stabilizer wherein the output signals of the embodiment of FIG. 25 have a plurality of wavelengths. In the arrangement of FIG. 48, fluxes of light from lasers LD1, LD2 are split by beam splitters BS1, BS2 and a part of these outputs are outputted as light outputs from the stabilizer. The rest of the split fluxes are introduced into acousto-optic defectors UM1, UM2, respectively. The outputs from deflectors UM1,UM2 are combined by beam splitters BS3,BS4 and are then applied to absorption cell CL1. In cell CL1 there is contained a standard substance, such as Cs, Rb, $NH_3$ or $H_2O$, which absorbs laser beams having multiple wavelengths. That is to say, a plurality of absorption spectrums are created in the light which is transmitted through cell CL1. The laser beams which are transmitted through cell CL1 impinge on light receiving element PD1 and are then converted into electric signals corresponding to the light receiving power. After the thus converted electric signals have been inputted to lock in amplifiers LA11, LA12, the signals are further added to electric current control circuits CT21, CT22.

The outputs from circuits CT21,CT22 are supplied to lasers LD1,LD2. Hence, as the electric current to be applied is prescribed by the signals added from the electric current control circuits CT21, CT22, the oscillating frequencies of lasers LD1, LD2 are determined by such electric current values. An oscillator SG2 ( frequency $f_S$ at 80 MHz, e.g.) is connected via switches SW1, SW2 to deflectors UM1, UM2, and the outputs (e.g. $fm_1=2$ kHz, $fm_2=2.5$ kHz) of oscillators SG11, SG12 are connected to switches SW1, SW2. Thus, the oscillating wavelength of light which passes through deflectors UM1, UM2 is modulated at frequency $fm_1$, $fm_2$. The outputs from oscillators SG11, SG12 are added to lock in amplifiers LA11, LA12 and are then synchronously rectified at frequencies $fm_1$, $fm_2$. A control means may be considered to comprise electric current control circuits CT21, CT22 and lock in amplifiers LA11, LA12.

Operation of the FIG. 48 embodiment is as follows. Cesium is used as the standard substance in absorption cell CL1. The output light from semiconductor laser LD1 is bidirectionally spit by beam splitter BS1. The reflected light becomes output light to be emitted to the outside. The transmitted light strikes deflector UM1. As in the case of FIG. 25, the output light having frequency $\omega_1$ from laser LD1 undergoes frequency modulation with modulation frequency $fm_1$ and depth of $f_D$ by deflector UM1. Thereafter, the modulated output passes through cell CL1. Similarly, light having frequency $\omega_2$ from laser LD2 is subjected to frequency modulation at modulation frequency $fm_2$ and depth $f_D$ by deflector UM2. Then, output light from deflector UM2 is then passed through cell CL1.

If the light having frequencies $\omega_1$, $\omega_2$ is made to penetrate the Cs atoms existing in cell CL1, with respect to the amount of transmitted light, there are obtained the absorption signals shown in FIG. 27, which correspond to the variations of $\omega_1$, $\omega_2$. Consequently, the output waveforms of lock in amplifiers LA11, LA12 takes the shapes depicted in FIGS. 49, 50, wherein the signals (see FIG. 27) sent from element PD1 are differentiated.

Assuming that light having frequency $\omega_1$ is modulated at modulation frequency $fm_1$ and light having frequency $\omega_2$ is likewise modulated at modulation frequency $fm_2$, and when the lock in amplifier LA11, LA12 are synchronously rectified at the modulation frequencies $fm_1$, $fm_2$, respectively (at this time, $fm_1$, $fm_2$ are set so that the formula $k \cdot fm_1 = n \cdot fm_2$ (k,n are integers) is established), the influences of light having frequency $\omega_2$ are not present in the output of lock in amplifier LA11. Similarly, the influences of light having frequency $\omega_1$ do not appear in the output of lock in amplifier LA12. Subsequently, the outputs from lock in amplifiers LA11, LA12 individually take the waveforms shown in FIG. 49 (outputs from amplifier LA11) and in FIG. 50 (outputs from amplifier LA12).

Figure 49:
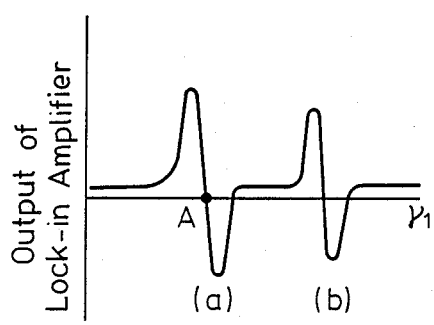
FIGS. 49 and 50 are views depicting an output of the lock in amplifier shown in FIG. 48.
Figure 50:
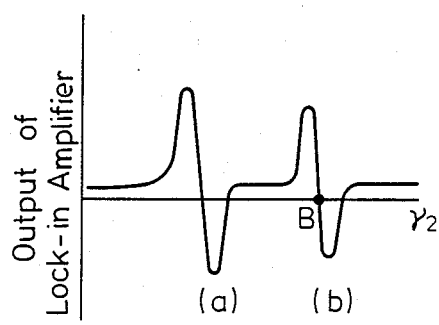

If the oscillating frequencies of lasers LD1, LD2 are controlled by control circuits CT21, CT22 so that the outputs from amplifier LA11 is at a point A of FIG. 49 and the output from amplifier LA12 is at a point B of FIG. 50, the wavelength is 852.112 nm or thereabout, thereby obtaining fluxes of light having two wavelengths which differ from each other by 9.2 GHz.

In the FIG. 48 embodiment, with simple construction utilizing a part of the cell CL1, it is feasible to output laser beams having a plurality of wavelengths, with high stability and accuracy.

Although Cs is used, Rb may also be used, in which case, the basic level has an infinitesimal structure wherein F=1, F=2. Assume that the frequency at which absorption is caused from F=1 is $\omega_1$, and the frequency at which absorption is cased from F=2 is $\omega_2$, and then, $\Delta\omega = \omega_1 - \omega_2$, which is defined as the difference therebetween becomes $\Delta\omega = 6.8$ GHz in time of $^{87}$Rb and further becomes $\Delta\omega = 3$ GHz in time of $^{85}$Rb. When using $D_1$ beams (excitation from level $5^2S_{\frac{1}{2}}$ to level $5^2P_{3/2}$ implies 794.7 nm)of Rb and $D_2$ beams (excitation from level $5^2S_{\frac{1}{2}}$ to level $5^2P_{\frac{1}{2}}$ imples 780.0 nm) of Rb, the formula $\Delta\lambda = 14.7$ nm is valid. By passing through the standard substance, such as Rb, this expression $\Delta\lambda = 852.1 - 780$ (or 794.7) = 72.1 (or 57.4) nm, is established. Moreover, molecular absorption beams of $H_2O$ and $NH_3$ or the like may also be used.

The number of semiconductor lasers need not be confined to the two shown, rather, any number may be used combining the above frequenices and altering the number of lock in amplifiers, deflectors, and control circuits used.

Figure 51:
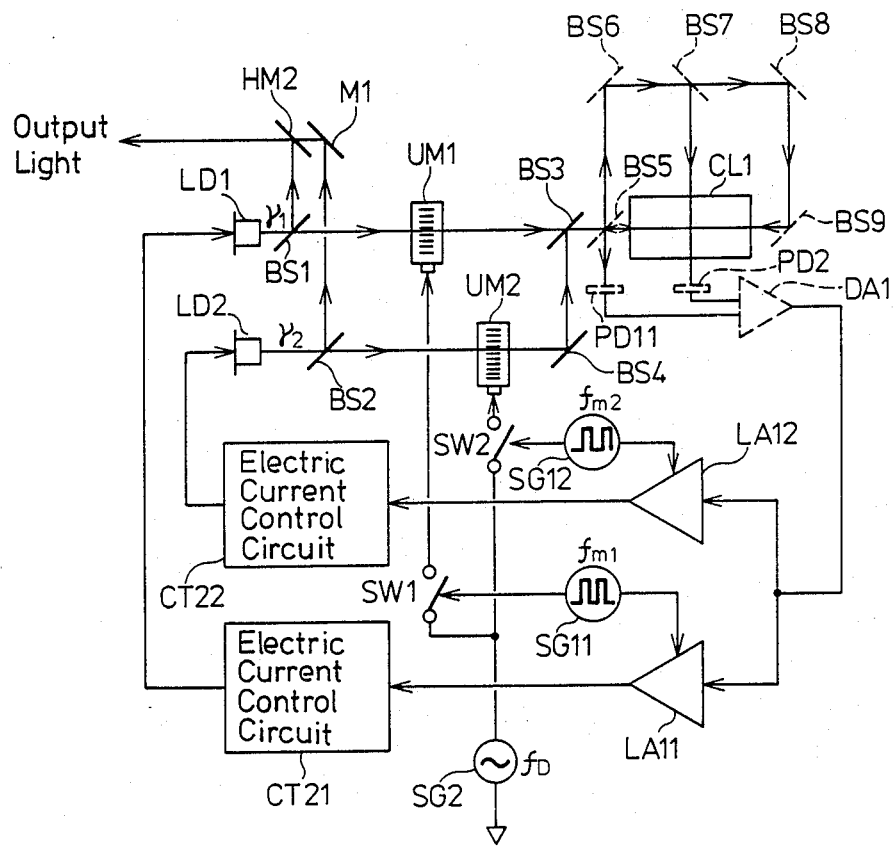
FIG. 51 is a block diagram depicting a seventeenth example of the frequency/stabilized semiconductor laser.

When adapting the embodiment of FIG. 51, which shows another example of a stabilizer wherein Doppler expansion disappears by virtue of the saturated absorption spectroscopy and it is possible to distinguish the infinitesimal structure described in FIG. 26. Consequently, there is obtained an output signal from lock in amplifier which is based on the infinitesimal structure shown in FIG.33, so that $\Delta\omega$ can further be reduced, depending on the position at which it is locked. The portion indicated by dotted line in FIG. 51 is different from FIG. 48. In FIG. 51 there are provided beam splitters BS5 to BS9; light receiving elements PD11, PD2 and differential amplifier DA1. The outputs from amplifier DA1 is arranged to be introduced into amplifiers LA11, LA12.

The higher harmonic wave frequency of $fm_1$ or the like can be used as the frequency of a signal to be inputted to lock in amplifier shown in FIG. 48. In this case, if a triplex harmonic wave is used, the bias component of lock in amplifiers shown in FIGS. 49,50 disappear.

Where a polarization beam splitter is used in place of beam splitters in FIG. 48, the output laser beams become orthogonal polarized beams.

Figure 52:
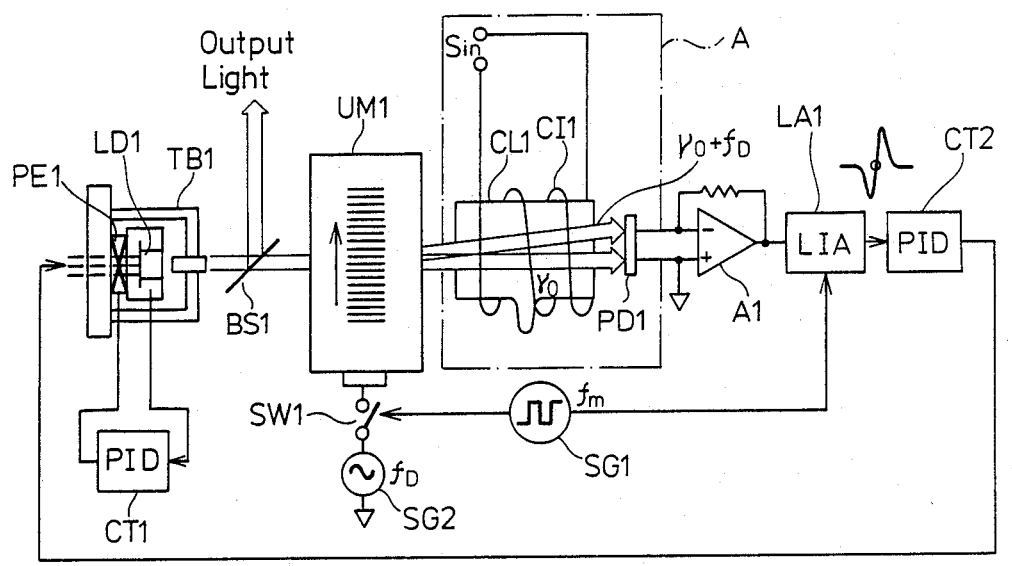
FIG. 52 is a block diagram depicting an eighteenth example of the frequency stabilized semiconductor laser.

FIG. 52 depicts another stabilizer wherein the wavelength is varied in such a manner as to correspond to the input signal. This embodiment differs from the FIG. 25 embodiment in that a coil CI1 which constitutes a magnetic applying means is provided about absorption cell CL1. Coil CI1 comprises two ends to which a variable wavelength input signal Sin is applied and is wound about cell CL1. As in the case of the embodiment of FIG. 25, the output light from laser LD1 is controlled to a stable frequency of $\omega_s = f_D/2$. When signal Sin is applied to the ends of coil CI1, electric current flows through coil CI1, thereby generating a magnetic field, the magnitude of which corresponds to signal Sin. By operation of this magnetic field, the absorption spectrum of the standard substance within cell CL1 causes Zeeman separation thereby to vary the absorption wavelength. Accompanied by variations of the absorption wavelength, the output wavelength of the laser LD1 is locked to the absorption beam changes. Thus, using variable input Sin, the wavelength of the laser LD1 can be changed.

The FIG. 52 embodiment advantageously produces output signals having wavelengths which are variable while still being stable and which which lock the semiconductor laser output to the absorption signal of the standard substance.

In the FIG. 52 embodiment, the coil is used as a magnetic applying means, but, other arrangements can also be used. For example, a permanent magnet can be used and its position relative to the cell CL1 can be varied.

Figure 53:
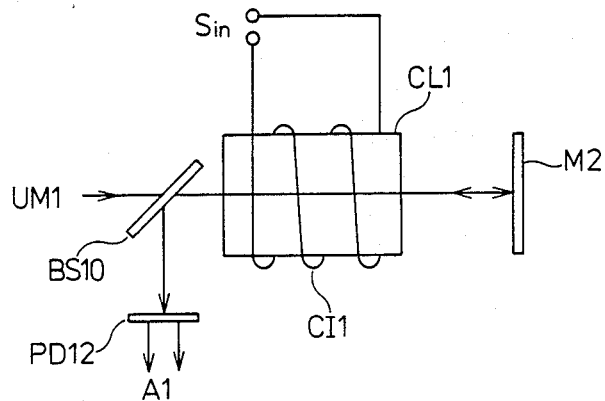
FIG. 53 is a block diagram depicting principal portions of a nineteenth example of the frequency stabilized semiconductor laser.

FIG. 53 depicts principal portions of component A of FIG. 52 changed to include other components and utilizing saturation absorption instead of linear absorption. Light which has been modulated by deflector UM1 falls, as pump light, through beam splitter BS10, upon cell CL1. Light which passes through cell CL1 then is reflected by mirror M2 and returned through the previous light path. The returned light, serving as probe light, strikes cell C1 once again. The transmitted light is reflected by beam splitter BS10, whereby the saturated absorption signal is detected by detector PD12. Other functions are the same as the FIG. 52 arrangement.

When applying the wavelength variable input signal Sin to the ends of coil CI1, as in FIG. 52, the absorption spectrum of the standard substance within cell CL1 causes Zeeman separation, whereby the saturated absorption wavelength varies. Referring to FIGS. 54, 55 and 56 ($m_F$ is the name of an energy level at which Zeeman separation is effected by magnetic modulation) there are shown aspects of Zeeman separation of the respective energy levels of Cs. FIG. 54 is a diagram showing characteristic curves of Zeeman separation of a $6^2P_{3/2}$ excitation level of Cs. FIG. 55 is a diagram showing characteristic from amplifier A1; curves of the Zeeman separation of a level of an infinitesimal structure of F=4 in which the basic state of Cs is $6^2S_{\frac{1}{2}}$. FIG. 56 is a diagram showin characteristic curves of Zeeman separation of a level of an infinitesimal structure of F=3 in which the basic state of Cs is $6^2S_{\frac{1}{2}}$. For example, if the frequency of laser LD1 is controlled to the absorption spectrum obtained when shifting from F=3 of $6^2S_{\frac{1}{2}}$ to F=2 of $6^2P_{3/2}$, the absorption spectrum shifts toward lower frequencies at the time of applying the magnetic field to the absorption cell CL1. As a result, the oscillating frequency of laser LD1 concurrently shifts toward the lower ones.

According to the FIG. 53 embodiment, in addition to the advantages of FIG. 52, variations in saturated absorption frequency is large with respect to the changes in magnitude of magnetic field and hence sensitivity increases. Also, since the width of the absorption spectrum is large in the arrangement of FIG. 52, as compared with that of FIG. 53, the output frequency can be controlled to the mean value of the energy levels (e.g. F=3 to 5 of FIG. 54) of the infinitesimal structure. Consequently, the sensitivity becomes smaller than this.

Figure 57:
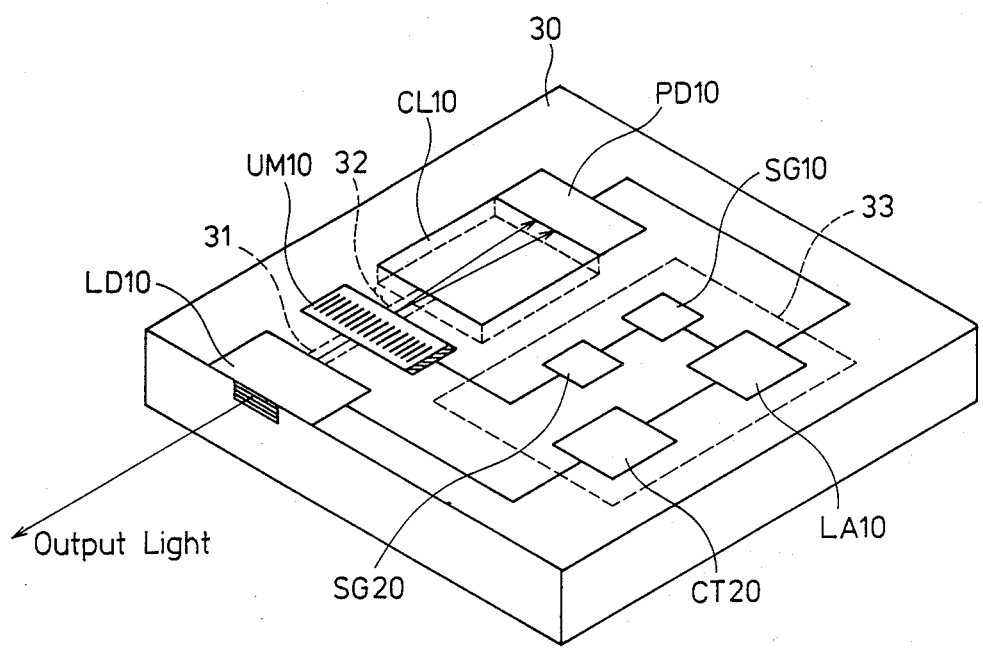
FIG. 57 is a block diagram depicting a twentieth example of the frequency stabilized semiconductor laser which is formed as an integrated circuit.

FIG. 57 depicts a stabilizer which is incorporated into an integrated circuit (called IC formation) on a semiconductor chip, wherein substrate 30, e.g. of GaAS, is used as a base on which the following are formed: semiconductor laser LD10; light waveguide path 31 upon which light from laser LD10 falls; acousto-optic deflector UM10; which receives light emerging from path 31; another waveguide path 32 which carries output light from deflector UM10; absorption member CL10 which encloses an standard substance, e.g. Cs, capable of absorbing light with a specified wavelength, with light emerging from path 32 impinging on member CL10; a light receiving member PD10 upon which emergent light from absorption member CL10 falls; and a control member 33 for receiving electric output from light receiving member PD10. Control member 33 comprises a lock in amplifier circuit LA10 the input of which is connected to the output of mmember PD10; an electric current control circuit CT20 consisting of PID controller circuit which includes an input connected to the output of lock in amplifier LA10 and its output being connected to an injection electtric current inpt of laser LD10; a signal generating circuit (i.e. an oscillating circuit) SG10 having a frequency fm (e.g. 2 kHz) with one output thereof serving to supply a reference signal input to lock in amplifier LA10; and a second signal generating circuit (i.e. oscillating circuit) SG20 with a frequency $f_D$ (e.g. 80 MHz), the output of which is connected to deflector UM10 and being modulated by the output from signal generator SG10.

Operation of the FIG. 57 embodiment is as follows. Advantageously, since the FIG. 57 embodiment is integrated on a single chip, it is possible to reduce the size of the invention, and use mass production techniques, and further enable simple and rapid adjustments and maintenance of the invention.

FIG. 58 is a table showing a method of fabricating the respective components depicted in FIG. 57. The fabrication may be monolithic or hybrid and use appropriate semiconductors, such as a silicon substrate.

Figure 59:
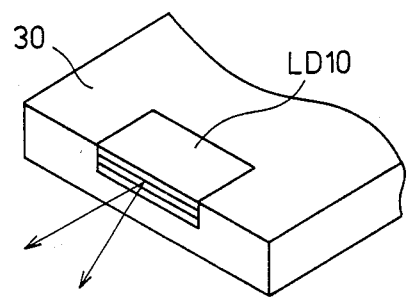
FIGS. 59 and 60 are perspective views depicting principal portions of another example of the arrangement of FIG. 57.
Figure 60:
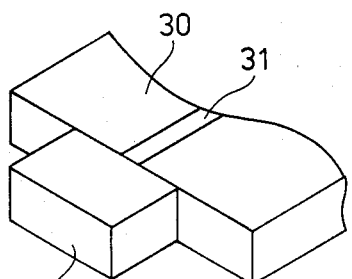
Figure 61:
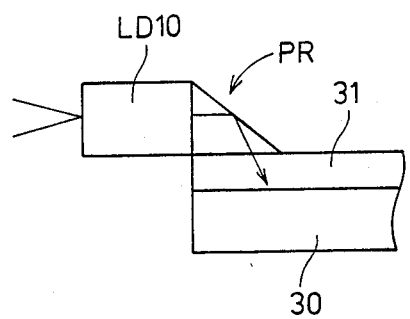
FIGS. 61, 62 and 63 are sectional views depicting principal portions of the integrated circuit.

FIG. 59 shows a semiconductor laser fabricated on a IC substrate 30 using monolithic construction. FIG. 60 shows a hybrid construction. FIG. 61 is a cross-sectional view of another example. In FIG. 60, the end surface of waveguide path 31 is formed on a substrate and is directly irradiated with the output from laser LD10. In FIG. 61, the output light from laser LD10 is arranged to be applied via prism PR into waveguide light path 31.

Figure 62:
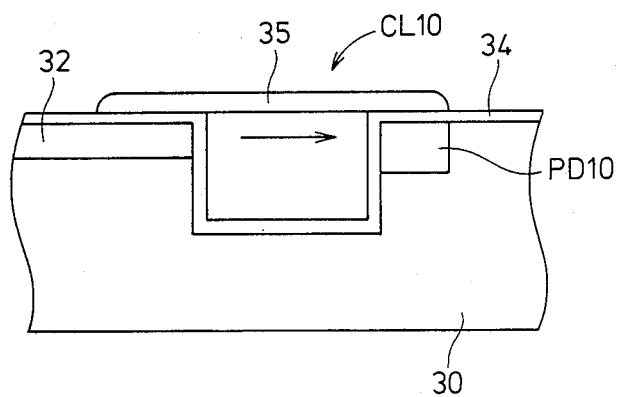

FIG. 62 is a cross sectional view of FIG. 57 wherein a recessed portion (see arrow) is formed by etching or other similar method in the surface of substrate 30. A glass film 34 is formed thereon by glass coating or fthermal oxidation. A standard substance, e.g. Cs, is placed into the recessed portion. The recessed portion is then sealed and covered with a glass plate 35 by fusion boding, thereby enclosing the standard substance forming the absorption member CL10.

Figure 63:
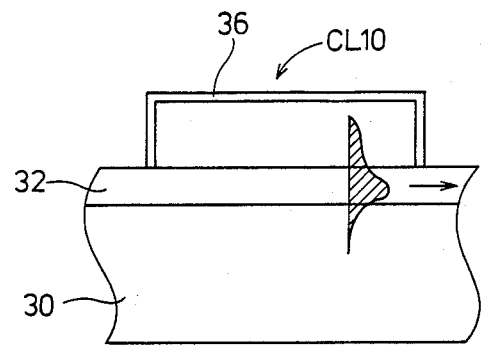

FIG. 63 is a cross sectional view showing another absorption member CL10 fabrication on the substrate, such as shown in FIG. 57. A waveguide path 32 is formed on substrate 30 comprising GaAs, LiNbO or the like. By the evanescent effect, the standard substance, e.g. Cs, is enclosed by cover 36 provided on top of waveguide path 32 and is arranged to absorb output light passing through the waveguide path 32 from laser LD10. With this embodiment, advantageously, manfucturing is simpler since the cell is formed above the substrate rather than a recess being built therein as inf FIG. 62.

The photo detecting member can be incorporated by monolithic or hybrid fabrication, in each of the above embodiments as desired.

Figure 64:
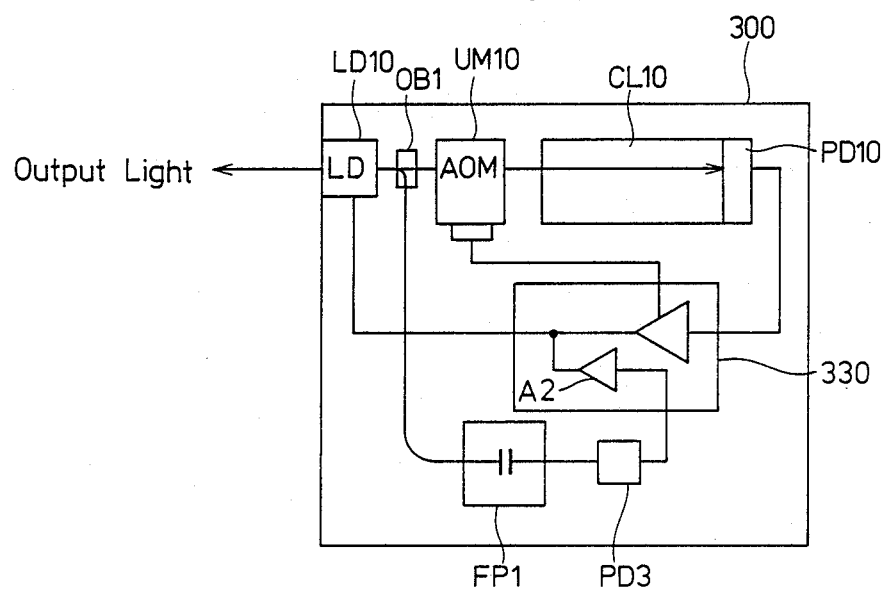
FIG. 64 is a plan view depicting a twenty first example of the frequency stabilized semiconductor laser, wherein the device of FIG. 57 is made still narrower in spectrum.

FIG. 64 depicts a plan view of another stabilizer fabricated on a single chip wherein the spectrum relative to the device of FIG. 57 is rendered much narrower. On substrate 30 are additionally provided, a light branching member OB1 for branching off a part of the fluxes of output light from laser LD10; a light resonant member FP1 consisting of a Fabry-Perot etalon which receives output light branched off by light branching member OB1; a second photodetecting member PD3 which receives output light from light resonant member FP1; and a broad band region amplifying member A2 for amplifying the electric outputs from detector PD3 and feeding the amplified outputs back to injection electric current supplied to laser LD10.

In this configuration, the broad band amplifier A2 (only roughly shown) is provided in control member 330. A resonant curve (the position which deviates from the central frequency) of the resonator. FP1 is made to accord with an oscillating wavelength of laser LD10. Phase noises contained in the output light from laser LD10 are detected by detector PD3 after converting them into amplitude modulation signals, and the electric outputs thereof are negatively fed via amplifier A2 having a band region which is wider than the width of the spectrum of the laser beam, back to the driving current (i.e. injection electric current) of laser LD10, thereby restraining the phase noises of laser LD10 and so as to make the spectrum still narrower (see M. Ohtsu and S. Kotajima, IEEE Journal of Quantum Electronics, Vo. QE-21, No. 12, December 1985).

Figure 65A:
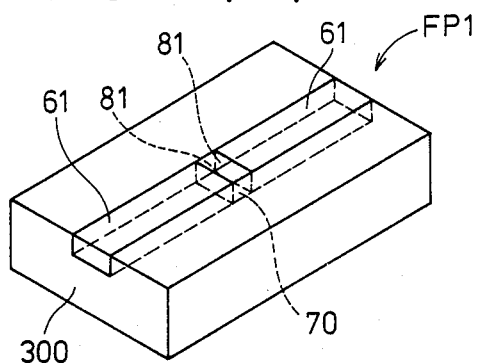
FIGS. 65(A), 65(B), 65(C) and 66 are views depicting principal portions of another example of the arrangement depicted in FIG. 64.
Figure 65B:
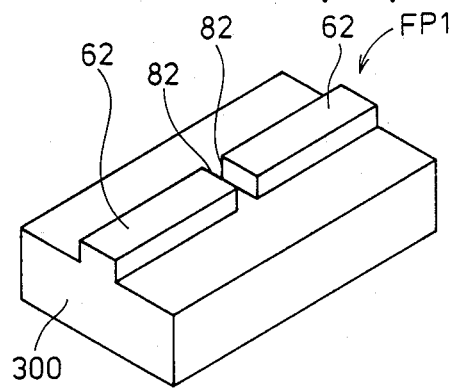
Figure 65C:
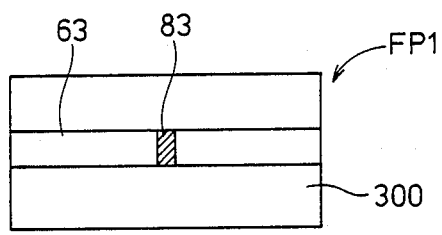

FIGS. 65(A) and 65(B) depict Fabry-Perot resonator FP1 provided on substrate 300 in the device of FIG. 64. FIG. 65(C) is a plan view of principal portions thereof. In FIG.65(A) a hole 70 is formed in a part of waveguide path 61 provided on substrate 300. Two surfaces, which partially constitute the hole 70, and disposed in the manner shown, are coated with reflection film, thus forming a resonator. In FIG. 65(B), two ridges 62, serving as waveguide pasth, are spaced from each other so as to be placed in series on the substrate 300. End surfaces 82 of these ridges 62, which surfaces are disposed as shown, are formed with reflection films, thus constituting a resonator. FIG. 65(C) depicts a material having a high refractive index doped to a part of waveguide path 63 provided on substrate 300, thus forming a resonant member 83.

Figure 66:
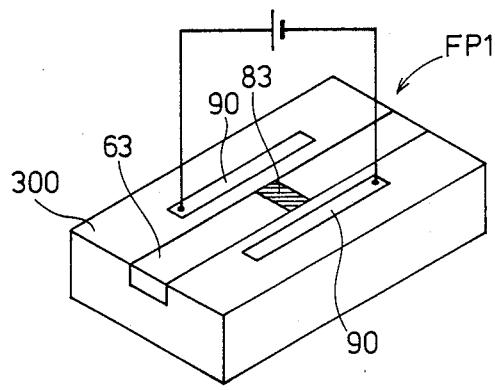

FIG. 66 depicts principal portions of a means for adjusting the resonant frequency of the resonator FP1 of the device of FIG. 65(C). In FIG. 66, electrodes 90 are provided on both sides of resonant member 83 disposed on substrate 300, and the effective length of the resonator 83 is varied by changing the refractive index of the resonator 83 using electric current applied to electrodes 90. As another means for adjusting the resonant frequency, a thin film resistor, which serves as a heater, is formed in close proximity to the light resonator provided on substrate, and the length of the resonator is varied by thermal expansion. In addition, a ferroelectric substance defined as a material having high refractive index is doped, and the refractive index is varied by applying a magnetic field thereto.

A thin film resistor may be used as heaters to control the temperatures of the laser LD10 and resonator FP1. In that case, the resistors used as heaters should be located away from each other so as to not interfere with each other.

In the embodiments of FIGS. 57 through 66, either the linear absorption method or the saturation absorption method may be used.

Figure 67:
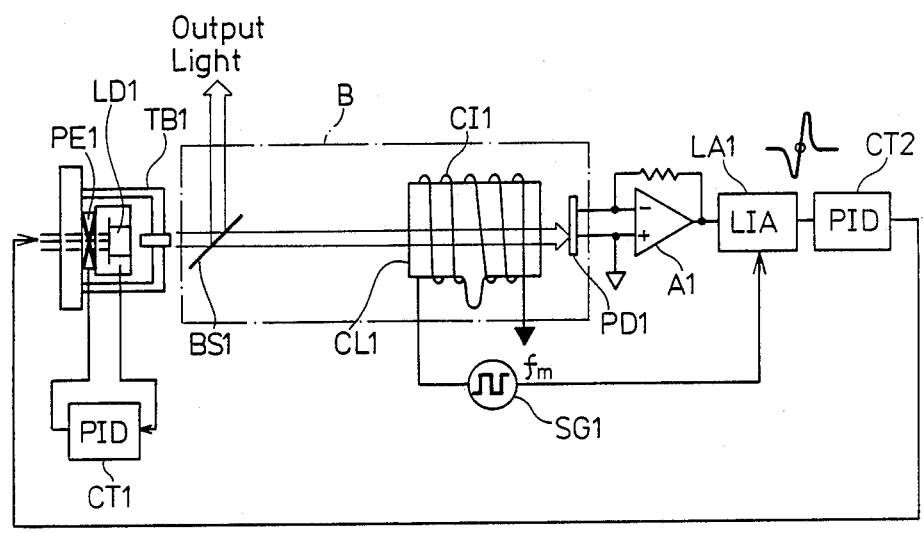
FIG. 67 is a block diagram depicting a twenty second example of the frequency stabilized semiconductor laser.

FIG. 67 depicts another stabilizer wherein the absorption wavelength of the absorption cell is controlled by a magnetic field. In the embodiment, a coil CI1 is wound on absorption cell CL1 and constitutes a magnetic field applying means. The output of transmitted light from beam splitter BS1 falls upon the cell CL1, and the outputs from signal generator SG1 arrange for electric current to flow which is modulated by the coil CI1 at a frequency fm (e.g. 2 kHz). Such outputs serve as reference signals to lock in amplifier LA1. On applying outputs from generator SG1 to both ends of coil CI1, an electric current modulated by coil CI1 begins to flow, thereby generating a magnetic field in which the intesity thereof varies at the frequency fm. Corresponding to the variations in this magnetic field, the absorption wavelength of the standard substance within cell CL1 is changed by Zeeman separation.

Figure 68:
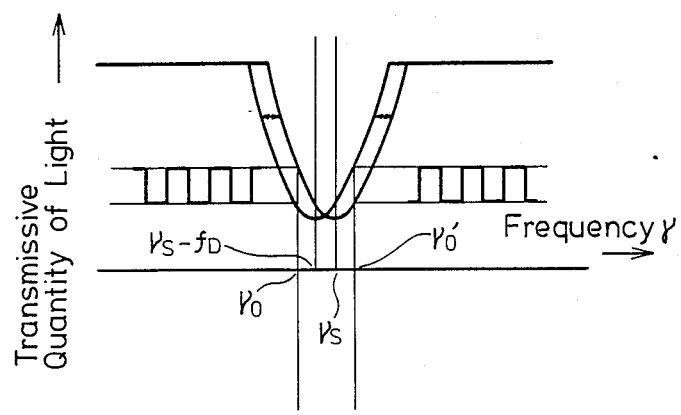
FIG. 68 is an explanatory view depicting operation of the arrangement depicted in FIG. 67.

As a result, laser beams fall upon cell CL1, signals are present in the output when the amount of transmitted light is, as shown in FIG. 68, modulated only at the position of the absorption signal. It is presumed that the magnetic field is modulated within a scope of 0 to a certain value of frequency fm. Frequency $\omega_s$ is the absorption frequency when the output electric current is 0, and when the magnetic field is 0, and $f_D$ is the degree to which the absorption frequency varies in time of the magnetic field being applied. This signal is converted into an electric signal by means of photo detector PD1 and is then synchronously rectified at frequency fm in lock in amplifier LA1 through the intermediary of amplifier A1, thereby obtaining a primary differential waveform illustrated in FIG. 29. As in the case of FIG.25, if the output of lock in amplifier LA1 is locked to the center of the primary differential waveform, the output from laser LD1 has a stable frequency of $\omega_s - f_D/2$.

According to FIG. 68, no acousto-optic defector is used and hence it is possible to obtain non-modulation outputs which exhibit high stability for frequency instantaneousness, in a compact device inexpensively produced. Since a deflector is not used, only a small amount of heat is evolved in the device, and power to be consumed is reduced. Furthermore, advantageously, either linear or saturated absorption method may be used. Since variation of saturated absorption frequency is large with respect to variations in magnetic field, even a low level modulation magnetic field can be used. That is to say the sensitivity of the magnetic field is high.

The foregoing description is illustrative of the principles of the invention. Nmmerous modifications and extensions thereof would be apparent to the worker skilled in the art. All such modifications and extensions are to be considered to be within the spirit and scope of the invention.

What is claimed is:

1. An optical frequency synthesizer/sweeper comprising
   a reference light source for generating an optical output signal having a wavelength; and
   a plurality of consecutively connected optical frequency phase locked loops for controlling the wavelength of said optical output signal and for producing an output signal;
   said plurality of optical frequency phase locked loops each comprising a variable wavelength light source for producing a output light and an optical heterodyne detector, said optical heterodyne detector receiving as inputs light associated with said output light from said variable wavelength light source and said optical output signal from said reference light source and outputting a signal to said variable wavelength light source so that the wavelength of said output signal from said each optical frequency phase locked loop is made variable on the basis of the wavelength of said optical output signal from said reference light source;
   wherein said reference light source is connected to one of said plurality of consecutively connected optical frequency phase locked loops and beams of output light from others of said plurality of consecutively connected optical frequency phase locked locked loops are arranged to respectively have a predetermined frequency interval with respect to light applied as an input thereto.

2. An optical frequency synthesizer/sweeper comprising
   a reference light source for generating an optical output signal having a wavelength; and
   at least one optical frequency phase locked loop for controlling the wavelength of said optical output signal and for producing an output signal;

said at least one optical frequency phase locked loop comprising a variable wavelength light source for producing an output light and an optical heterodyne detector, said optical heterodyne detector receiving as inputs light associated with said output light from said variable wavelength light source and said optical output signal from said reference light source and outputting a signal to said variable wavelength light source so that the wavelength of said output signal from said at least one optical frequency phase locked loop is made variable on the basis of the wavelength of said optical output signal from said reference light source; wherein said at least one optical frequency phase locked loop comprises an optical frequency shifter for shifting the frequency of said output light from said variable wavelength light source and for producing an output light, and wherein said output light from said optical frequency shifter is emitted and applied as an input to said optical heterodyne detector.

3. An optical frequency synthesizer/sweeper comprising
a reference light source for generating an optical output signal having a wavelength; and
at least one optical frequency phase locked loop for controlling the wavelength of said optical output signal and for producing an output signal;
said at least one optical frequency phase locked loop comprising a variable wavelength light source for producing an output light and an optical heterodyne detector, said optical heterodyne detector receiving as inputs light associated with said output light from said variable wavelength light source and said optical output signal from said reference light source and outputting a signal to said variable wavelength light source so that the wavelength of said output signal from said at least one optical frequency phase locked loop is made variable on the basis of said optical output signal from said reference light source; and wherein said at least one optical frequency phase locked loop comprises an optical frequency multiplier for multiplying the frequency of said output light from said variable wavelength light source and applying the resultant signal as an input to said optical heterodyne detector.

4. The arrangement of claim 2 or 3, wherein said reference light source generates light having a plurality of oscillation wavelengths, and said at least one optical frequency phase locked loop comprises means for controlling the wavelengths of said output signal such as to correspond to the plurality of oscillation wavelengths.

5. The arrangement of claim 2 or 3, wherein said output signal from said at least one optical frequency phase locked loop is applied to an absorption cell comprising a standard substance, said output signal being subjected to absorption at a specified wavelength in said absorption cell and outputted as a marker light.

6. The arrangement of claim 2 or 3, wherein said reference light source comprises a laser diode, and means for controlling the oscillation wavelength of said laser diode to be at the absorption spectrums of Rb atoms, Cs atoms, $NH_3$ molecules or $H_2O$ molecules.

7. The arrangement of claim 2 or 3, wherein said reference light source comprises a laser diode, and means for controlling the oscillation wavelength of said laser diode to be at least one absorption spectrum of a $D_2$ line and a $D_1$ line of Rb atoms, and wherein said at least one optical frequency phase locked loop outputs said output signal having a wavelength band which is twice as large as that of the oscillation wavelength.

8. The arrangement of claim 2 or 3, wherein said at least one optical frequency phase locked loop further comprises a Fabry-Perot etalon for inputting the output signal from said at least one optical frequency phase locked loop and outputting an optical output signal having a predetermined wavelength.

9. The arrangement of claim 2 or 3, wherein said reference light source comprises a modulation means for effecting frequency modulation by receiving a part of an output light from a semiconductor laser and for producing an output light; an absorption cell for enclosing a standard substance which causes absorption at a given wavelength by receiving said output light from said modulation means and transmitting light; a photo detector for converting transmitted light from said absorption cell into electrical signals; and control means for controlling oscillating wavelength of said semiconductor laser by inputting signals based on said electric signals from said photo detector.

10. The arrangement of claim 9, wherein said control means comprises a lock in amplifier connected to said photo detector, to said semiconductor laser, and to said modulation means for receiving electric signals relative to said electric signals from said photo detector and for effecting synchronous rectification at a modulation frequency of said modulation means or at a frequency of an odd numbered multiple thereof, and regulating means connected to said semiconductor laser and to said at least one optical frequency phase locked loop for controlling electric current applied to said semiconductor laser or for controlling a temperature thereof so that an output from said lock in amplifier is of a specified value.

11. The arrangement of claim 9, wherein said modulation means comprises an acousto-optic deflector.

12. The arrangement of claim 9, wherein said modulation means comprises a phase modulator comprising an electro-optical element.

13. The arrangement of claim 9, wherein said standard substance comprises Rb or C.

14. The arrangement of claim 9, further comprising a reflection member for effecting reflection of light transmitted through said absorption cell and for causing the light to strike upon said absorption cell at least one more time.

15. The arrangement of claim 9, wherein at least part of said absorption cell comprises a vessel comprising a transmissive material, and wherein a surface of said vessel upon which light is incident and a surface thereof from which light emerges are inclined at predetermined angles to a plane orthogonal to a central axis of said vessel.

16. The arrangement of claim 9, wherein said reference light source comprises a variable gain amplifier having a gain and located between said photo detector and said semiconductor laser and means for controlling said gain using said output signals from said photo detector.

17. The arrangement of claim 9, wherein said reference light source comprises a magnetic field applying means for applying a magnetic field having a magnitude corresponding to an input signal applied to said absorption cell; and means for outputting a laser beam having a wavelength varying in accordance with said input signal applied to said absorption cell.

18. The arrangement of claim 2 or 3, wherein said reference light source comprises a semiconductor laser, a substrate, and provided on said substrate modulation means for receiving output light from said semiconductor laser via a light waveguide path and externally modulating an output from said semiconductor laser; an absorption member for enclosing a standard substance which causes absorption at a specified wavelength, said absorption member receiving output light from said light modulation means via said light waveguide path; a photo detector for converting transmitted light from said absorption member into electric signals; and control means for controlling electric current applied to said semiconductor laser so as to correspond to electric signals relative to signals from said photo detector.

19. The arrangement of claim 18, wherein said control means comprises a lock in amplifier which effects synchronous rectification at a frequency relative to a modulation frequency of said modulation means.

20. The arrangement of claim 18, wherein said modulation means comprises an acousto-optic deflector.

21. The arrangement of claim 18, wherein said modulation means comprises a phase modulator comprising an electro-optic element.

22. The arrangement of claim 2, or 3, wherein said reference light source comprises an semiconductor laser for emitting an output light, an absorption cell for enclosing a standard substance which causes absorption at a specified wavelength and for transmitting said output light of said semiconductor laser; magnetic applying means for applying a magnetic field to said absorption cell; modulation means for varying the intensity of said magnetic field outputted from said magnetic applying means at a fixed frequency; and a photo detector for converting transmitted light from said absorption cell into output electric current; wherein electric current applied to said semiconductor laser or the temperature of said semiconductor laser is controlled by signals representing said output electric current from said photo detector.

23. An optical frequency synthesizer/sweeper comprising
 a reference light source for generating an optical output signal having a wavelength; and
 at least one optical frequency phase locked loop for controlling the wavelength of said optical output signal and for producing an output signal;
 said at least one optical frequency phase locked loop comprising a variable wavelength light source for producing an output light and an optical heterodyne detector, said optical heterodyne detector receiving as inputs light associated with said output light from said variable wavelength light source and said optical output signal from said reference light source and outputting a signal to said variable wavelength light source so that the wavelength of said output signal from said at least one optical frequency phase locked loop is made variable on the basis of the wavelength of said optical output signal from said reference light source; wherein said at least one optical frequency phase locked loop further comprises a mixer for mixing an electric output from said optical heterodyne detector with an offset frequency signal and for producing an electric output; and said variable wavelength light source controls the wavelength of said output signal from said at least one optical frequency phase locked loop using said electric output from said mixer.

24. The arrangement of claim 23, wherein said mixer comprises means for removing frequency modulation components from said output signals outputted by said at least one optical frequency phase locked loop.

25. The arrangement of claim 2, 3, 23 or 24, wherein said optical heterodyne detector comprises a wavelength stabilizing light source; an optical frequency mixer for mixing the output from said wavelength stabilizing light source and an output from an optical frequency multiplying member; and a photo detector for receiving light from said optical frequency mixer and said optical output signal from said reference light source.

26. The arrangement of claim 25, wherein said variable wavelength light source comprises a tunable laser diode having wavelength selectivity by utilizing optical diffraction caused by an ultrasonic modulator, said tunable laser diode being provided with a resonator.

27. The arrangement of claim 25, wherein said variable wavelength light source comprises a tunable laser diode capable fo controlling the refractive indices of a light path within said resonator.

28. The arrangement of claim 2, 3, 23 or 24, wherein said variable wavelength light source comprises a tunable laser diode having wavelength selectivity by utilizing optical diffraction caused by an ultrasonic modulator, said tunable laser diode being provided within a resonator.

29. The arrangement of claim 2, 3, 23 or 24, wherein said variable wavelength light source comprises a tunable laser diode capable of controlling a refractive index of a light path within a resonator.

30. An optical frequency synthesizer/sweeper comprising
 a reference light source for generating an optical output signal having a wavelength; and
 at least one optical frequency phase locked loop for controlling the wavelength of said optical output signal and for producing an output signal;
 said at least one optical frequency phase locked loop comprising a variable wavelength light source for producing an output light and an optical heterodyne detector, said optical heterodyne detector receiving as inputs light associated with said output light from said variable wavelength light source and said optical output from said reference light source and outputting a signal to said variable wavelength light source so that the wavelength of said output signal from said optical frequency phase locked loop is made variable on the basis of the wavelength of said optical output signal from said reference light source;
 wherein said reference light source comprises a semiconductor laser for emitting a non-modulation optical output signal and means for applying a light relative to said non-modulation optical output signal to an absorption cell, wherein an output of transmitted light from said absorption cell is amplitude modulated on the basis of a frequency modulation signal through a modulation means by virtue of absorption properties of said absorption cell, wherein transmitted light from said absorption cell is converted into electrical signals by a photodetector, and control means for controlling said semiconductor laser.

31. An optical frequency synthesizer/sweeper comprising
  a reference light source for generating an optical output signal having a wavelength; and
  at least one optical frequency phase locked loop for controlling the wavelength of said optical output signal and for producing an output signal;
  said at least one optical frequency phase locked loop comprising a variable wavelength light source for producing an output light and an optical heterodyne detector, said optical heterodyne detector receiving as inputs light associated with said output light from said variable wavelength light source and the optical output signal from said reference light source and outputting a signal to said variable wavelength light source so that the wavelength of said output signal from said at least one optical frequency phase locked loop is made variable on the basis of the wavelength of said optical output signal from said reference light source;
  wherein said reference light source comprises a semiconductor laser for emitting said optical output signal, modulation means for effecting frequency modulation by receiving part of said optical output signal and for outputting an output light; an absorption cell for enclosing a standard substance which causes absorption at a given wavelength by receiving said output light from said modulation means; a photo detector for converting transmitted light from said absorption cell into electric signals; and control means for controlling the oscillating wavelength of said semiconductor laser by receiving signals based on said electric signals from said photo detector;
  wherein a part of said output light from said semiconductor laser is made incident upon an optical fiber passing through said standard substance within said absorption cell, and wherein the evanescent portion of light travelling through said optical fiber is used for absorption.

32. An optical frequency synthesizer/sweeper comprising
  a reference light source for generating an optical output signal having a wavelength; and
  at least one optical frequency phase locked loop for controlling the wavelength of said optical output signal and for producing an output signal;
  said at least one optical frequency phase locked loop comprising a variable wavelength light source for producing an output light and an optical heterodyne detector, said optical heterodyne detector receiving as inputs light associated with said output light from said variable wavelength light source and said optical output signal from said reference light source and outputting an signal to said variable wavelength light source so that the wavelength of said output signal from said at least optical frequency phase locked loop is made variable on the basis of the wavelength of said optical output signal from said reference light source;
  wherein said reference light source comprises a semiconductor laser for emitting said optical output signal, modulation means for effecting frequency modulation by receiving part of said optical output signal and for outputting an output light; an absorption cell for enclosing a standard substance which causes absorption at a given wavelength by receiving said output light from said modulation means; a photo detector for converting transmitted light from said absorption cell into electrical signals; and control means for controlling the oscillating wavelength of said semiconductor laser by receiving signals based on said electric signals from said photo detector;
  wherein said reference light source comprises a temperature control means for controlling the temperature of said absorption cell to be at a preset value.

33. An optical frequency synthesizer/sweeper comprising
  a reference light source for generating an optical output signal having a wavelength; and
  at least one optical frequency phase locked loop for controlling the wavelength of said optical output signal and for producing an output signal;
  said at least one optical frequency phase locked loop comprising a variable wavelength light source for producing an output light, and an optical heterodyne detector, said optical heterodyne detector receiving as inputs lights associated with said output light from said variable wavelength light source and said output signal from said reference light source and outputting a signal to said variable wavelength light source so that the wavelength of said output signal from said at least one optical frequency phase locked loop is made variable on the basis of the wavelength of said optical output signal from said reference light source;
  wherein said reference light source comprises a semiconductor laser for emitting said optical output signal, modulation means for effecting frequency modulation by receiving part of said optical output signal and for outputting an output light; an absorption cell for enclosing a standard substance which causes absorption at a given wavelength by receiving said output light from said modulation means; a photo detector for converting transmitted light from said absorption cell into electric signals; and control means for controlling the oscillating wavelength of said semiconductor laser by receiving signals based on said electric signals from said photo detector;
  wherein said absorption cell is coated with at least one sheet of magnetic material and a sheet of adiabatic material.

34. An optical frequency synthesizer/sweeper comprising
  a reference light source for generating an optical output signal having a wavelength; and
  at least one optical frequency phase locked loop for controlling said wavelength of said optical output signal and for producing an output signal;
  said at least one optical frequency phase locked loop comprising a variable wavelength light source and for producing an output light and an optical heterodyne detector, said optical heterodyne detector receiving as inputs light associated with said output light from said variable wavelength light source and said optical output signal from said reference light source and outputting a signal to said variable wavelength light source so that the wavelength of said output signal from said at least one optical frequency phase locked loop is made variable on the basis of the wavelength of said optical output signal from said reference light source;
  wherein said reference light source comprises a plurality of semiconductor lasers, each for generating a respective said optical output signal; a plurality of modulation means for effecting frequency modulation at different modulation frequencies by receiving part of the fluxes of output light from each of said plurality of semiconductor lasers; an absorption cell for enclosing a standard substance which causes absorption at a plurality of specified wavelength by receiving output fluxes from said plurality of modulation means; a photo detector for converting transmitted light from said absorption cell into electric signals; and control means for controlling the oscillating wavelength of said optical output signal from each of said plurality of semiconductor lasers by receiving signals based on an output signal from said photo detector.

35. An optical frequency synthesizer/sweeper comprising a reference light source for generating an optical output signal having a wavelength; and at least one optical frequency phase locked loop for controlling the wavelength of said optical output signal and for producing an output signal;

said at least one optical frequency phase locked loop comprising a variable wavelength light source for producing an output light and an optical heterodyne detector; said optical heterodyne detector receiving as inputs light associated with said output light from said variable wavelength light source and said optical output signal from said reference light source and outputting a signal to said variable wavelength light source so that the wavelength of said output signal from said at least one optical frequency phase locked loop is made variable on the basis of the wavelength of said optical output signal from said reference light source;

wherein said reference light source comprises a semiconductor laser for emitting an optical output signal, a substrate, and provided on said substrate modulation means for receiving said optical output signal from said semiconductor laser via a light wave guide path and externally modulating said optical output signal of said semiconductor laser; an absorption member for enclosing a standard substance which causes absorption at a specified wavelength, said absorption member receiving output light from said modulation means via said light waveguide path; a photo detector for converting transmitted light from said absorption member into electric signals; and control means for controlling electric current applied to said laser so as to correspond to electric signals relative to signals from said photo detector;

wherein said absorption member is formed with a glass film deposited on a recessed portion formed in a surface of said substance by glass coating or oxidation, and said absorption member encloses said standard substance with a glass plate.

36. An optical frequency synthesizer/sweeper comprising a reference light source for generating an optical output signal having a wavelength; and at least one optical frequency phase locked loop for controlling the wavelength of said optical output signal and for producing an output signal;

said at least one optical frequency phase locked loop comprising a variable wavelength light source for producing an output light and an optical heterodyne detector, said optical heterodyne detector receiving as inputs lights associated with said output light from said variable wavelength light source and said optical output signal from said reference light source and outputting a signal to said variable wavelength light source so that the wavelength of said output signal from said at least one optical frequency phase locked loop is made variable on the basis of the wavelength of said optical output signal from said reference light source;

wherein said reference light source comprises a semiconductor laser for emitting an optical output signal, a substrate, and provided on said substrate modulation means for receiving said optical output signal from said semiconductor laser via a light waveguide path and externally modulating said optical output signal from said semiconductor laser; an absorption member for enclosing a standard substance which causes absorption at a specified wavelength, said absorption member receiving output light from said modulation means via said light waveguide path; a photo detector for converting transmitted light from said absorption member into electric signals; and control means for controlling electric current applied to said laser so as to correspond to electric signals relative to signals from said photo detector;

wherein said substrate comprises a light branching member for branching off part of said optical output signal from said semiconductor laser; and wherein said reference light source further comprises a light resonator for receiving branched output light from said light branching member; a second photo detector for receiving output light from said light resonator; and a broad band region amplifying member for amplifying electric output from said second photo detector and feeding said electric output back as an injection electric current applied to said semiconductor laser.

* * * * *